United States Patent
Shimizu et al.

(10) Patent No.: US 8,178,285 B2
(45) Date of Patent: May 15, 2012

(54) METHOD FOR MANUFACTURING PIEZOELECTRIC/ELECTROSTRICTIVE FILM TYPE ELEMENT

(75) Inventors: Hideki Shimizu, Aichi (JP); Mutsumi Kitagawa, Aichi (JP)

(73) Assignee: NGK Insulators, Ltd., Nagoya (JP)

( * ) Notice: Subject to any disclaimer, the term of this patent is extended or adjusted under 35 U.S.C. 154(b) by 556 days.

(21) Appl. No.: 12/398,537

(22) Filed: Mar. 5, 2009

(65) Prior Publication Data

US 2009/0317750 A1 Dec. 24, 2009

(30) Foreign Application Priority Data

Mar. 6, 2008 (JP) .................... 2008-055825

(51) Int. Cl.
 G03F 7/00 (2006.01)
 H01L 41/22 (2006.01)
 B41J 2/045 (2006.01)
(52) U.S. Cl. .......... 430/312; 430/311; 29/25.35; 347/70
(58) Field of Classification Search .............. 430/311, 430/312; 29/25.35; 347/70
See application file for complete search history.

(56) References Cited

U.S. PATENT DOCUMENTS

| 6,089,701 | A * | 7/2000 | Hashizume et al. | 347/70 |
| 6,309,055 | B1 * | 10/2001 | Sakai et al. | 347/70 |
| 6,662,418 | B1 * | 12/2003 | Yun et al. | 29/25.35 |
| 6,701,593 | B2 * | 3/2004 | Lin et al. | 29/25.35 |
| 6,760,960 | B2 * | 7/2004 | Sakaguchi et al. | 29/25.35 |
| 7,096,547 | B2 * | 8/2006 | Yun et al. | 29/25.35 |
| 2004/0072432 | A1 * | 4/2004 | Yun et al. | 438/689 |
| 2011/0056059 | A1 * | 3/2011 | Shimizu et al. | 29/25.35 |

FOREIGN PATENT DOCUMENTS

| JP | 07-201226 | 8/1995 |
| JP | 3999044 | 8/2007 |

* cited by examiner

Primary Examiner — Amanda C. Walke
(74) Attorney, Agent, or Firm — Burr & Brown

(57) ABSTRACT

A manufacturing method for a piezoelectric/electrostrictive film type element and a film constituting a laminated vibrator made of laminations of an electrode film and a piezoelectric/electrostrictive film in a plane position. The piezoelectric/electrostrictive film type element includes a substrate, a lower electrode film provided on the substrate, and a laminated vibrator made of laminations of a piezoelectric/electrostrictive film and an upper electrode film. The lower electrode film is formed by a photolithography method with the substrate, where a cavity is filled with a light shielding agent, as a mask. Thereafter, the piezoelectric/electrostrictive film is formed by electrophoresis of powder of a piezoelectric/electrostrictive material toward the lower electrode film, and the upper electrode film is formed by the photolithography method with the piezoelectric/electrostrictive film as a mask. The piezoelectric/electrostrictive film may be formed by the photolithography method with the lower electrode film as a mask.

17 Claims, 54 Drawing Sheets

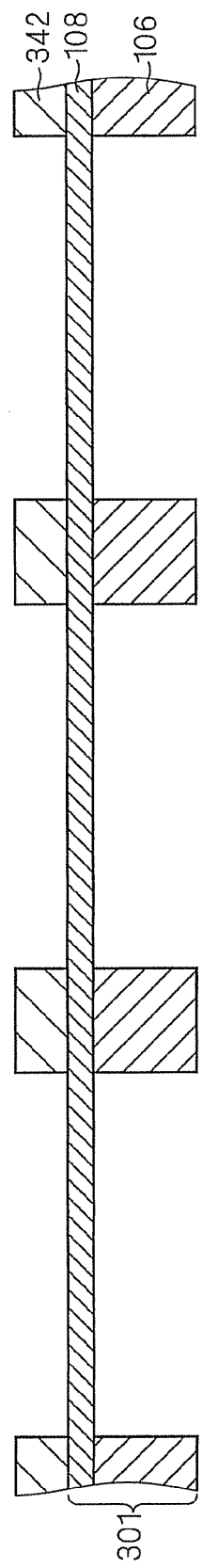

F I G . 3 9

| | EXAMPLE 1 | EXAMPLE 2 | COMPARATIVE EXAMPLE 1 | EXAMPLE 3 | COMPARATIVE EXAMPLE 2 |
|---|---|---|---|---|---|
| PRESENCE OR ABSENCE OF LIGHT SHIELDING AGENT | PRESENT | PRESENT | ABSENT | PRESENT | ABSENT |
| TYPE OF LIGHT SHIELDING AGENT | DYE-RELATED | PIGMENT-RELATED | — | PIGMENT-RELATED | — |
| PLATE THICKNESS t1 OF BASE PLATE | 100 μm | 100 μm | 100 μm | 100 μm | 100 μm |
| PLATE THICKNESS t2 OF BASE PLATE | 500 μm | 500 μm | 500 μm | 50 μm | 50 μm |
| PLATE THICKNESS t3 OF DIAPHRAGM | 12 μm | 12 μm | 12 μm | 3 μm | 3 μm |
| ESTIMATION RESULT | △ | ○ | × | ○ | × |

F I G . 4 1

|  | EXAMPLE 4 |
|---|---|
| PRESENCE OR ABSENCE OF LIGHT SHIELDING AGENT | ABSENT |
| TYPE OF LIGHT SHIELDING AGENT | — |
| PLATE THICKNESS t1 OF BASE PLATE | 100 μm |
| PLATE THICKNESS t2 OF BASE PLATE | — |
| PLATE THICKNESS t3 OF BASE PLATE | 12 μm |
| ESTIMATION RESULT | △ |

METHOD FOR MANUFACTURING PIEZOELECTRIC/ELECTROSTRICTIVE FILM TYPE ELEMENT

FIELD OF THE INVENTION

The present invention relates to a manufacturing method of piezoelectric/electrostrictive film type element comprising a substrate in which a cavity is provided, and a laminated vibrator made of laminations of an electrode film and a piezoelectric/electrostrictive film provided on a first main surface of the substrate so as to position with the cavity in a plane position.

BACKGROUND OF THE INVENTION

Sectional views of FIG. 42 is schematic views for illustrating a conventional manufacturing method of piezoelectric/electrostrictive film type element consisting a major part of a piezoelectric/electrostrictive actuator for discharging ink used in an inkjet printer head.

In the conventional manufacturing method, first, as shown in FIG. 42(a), a paste of a conductive material is applied by screen printing on a surface of a substrate 902 in which a cavity 926 to be an ink pressurized chamber is formed, to form a lower electrode film 912 by firing a resultant application film. Thereafter, as shown in FIG. 42(b), a paste of a piezoelectric/electrostrictive material is applied by screen printing to overlap on the lower electrode film 912, to form a piezoelectric/electrostrictive film 914 by firing a resultant application film. Further thereafter, as shown in FIG. 42(c), a paste of a conductive material is applied by screen printing to overlap on the piezoelectric/electrostrictive film 914, to form an upper electrode film 916 by firing a resultant application film.

Patent Document 1 discloses a manufacturing method of a piezoelectric/electrostrictive actuator for discharging ink used in an inkjet printer head.

Patent Document 1: Patent Gazette No. 3999044

SUMMARY OF THE INVENTION

However, the conventional manufacturing method has a problem to cause displacement of the entire part or a part of a lower electrode film, piezoelectric/electrostrictive film and an upper electrode film, and a cavity in a plane position due to a variation of a size or deformation of a substrate and a screen plate, resulting in a variation of an ink discharging amount of a piezoelectric/electrostrictive actuator. This problem is seen not only in a piezoelectric/electrostrictive film type element constituting a major part of a piezoelectric/electrostrictive actuator, but also common in a piezoelectric/electrostrictive film type element comprising a substrate in which a cavity is provided, and a laminated vibrator made of laminations of an electrode film and a piezoelectric/electrostrictive film provided on a surface of the substrate so as to position with the cavity in a plane position, for example, a piezoelectric thin-film resonator (FBAR; Film Bulk Acoustic Resonator) having a diaphragm structure, or the like. Further, this problem also arises when a film constituting the laminated vibrator is formed by methods other than screen printing, for example, sputter deposition, sol-gel process, MOCVD (Metal Organic Chemical Vapor Deposition) or any other similar methods.

The present invention has been made to solve the above problem, and has an object to provide a manufacturing method of a piezoelectric/electrostrictive film type element capable of preventing displacement of a cavity and a film constituting a laminated vibrator made of laminations of an electrode film and a piezoelectric/electrostrictive film in a plane position.

To solve the above problem, according to a first aspect of the invention, a manufacturing method of a piezoelectric/electrostrictive film type element including a substrate in which a cavity is formed, and a laminated vibrator made of laminations of an electrode film and a piezoelectric/electrostrictive film provided on a first main surface of the substrate so as to position with the cavity in a plane position, the manufacturing method includes the steps of: (a) forming a first photosensitive film on the first main surface of the substrate, (b) irradiating a light from a side of a second main surface of the substrate to depict a latent image, in which a plain shape of the cavity is transferred, on the first photosensitive film, (c) removing the first photosensitive film formed in a region where the cavity is formed, by development, (d) forming a lowermost film constituting the laminated vibrator in a region where the first photosensitive film is removed, and (e) removing the first photosensitive film remaining in a region where the cavity is not formed.

According to a second aspect of the invention, the manufacturing method of a piezoelectric/electrostrictive film type element according to the first aspect of the invention, further includes the step of: (f) before the step (b), filling a light shielding agent into the cavity, and wherein in the step (b), the first photosensitive film formed in the region where the cavity is not formed is selectively exposed, and in the step (c), an unexposed part of the first photosensitive film is removed.

According to a third aspect of the invention, in the manufacturing method of a piezoelectric/electrostrictive film type element according to the second aspect of the invention, the light shielding agent includes a pigment.

According to a fourth aspect of the invention, in the manufacturing method of a piezoelectric/electrostrictive film type element according to the first aspect of the invention, in the step (b), the first photosensitive film formed in the region where the cavity is formed is selectively exposed, and in the step (c), an exposed part of the first photosensitive film is removed.

According to a fifth aspect of the invention, the manufacturing method of a piezoelectric/electrostrictive film type element according to the fourth aspect of the invention, further includes the step of: (g) before the step (b), forming a light shielding film in a region in the second main surface of the substrate where the cavity is not formed.

According to a sixth aspect of the invention, in the manufacturing method of a piezoelectric/electrostrictive film type element according to the fifth aspect of the invention, the light shielding film includes a pigment.

According to a seventh aspect of the invention, the manufacturing method of a piezoelectric/electrostrictive film type element according to any of the first to sixth aspects of the invention, further includes the steps of: (h) after the step (e), forming a second photosensitive film to overlap on any piezoelectric/electrostrictive film constituting the laminated vibrator on the first main surface of the substrate, (i) irradiating a light from a side of the second main surface of the substrate to selectively expose the second photosensitive film formed in a region where the above any piezoelectric/electrostrictive film is not formed, (j) removing an unexposed part of the second photosensitive film, (k) forming an electrode film constituting the laminated vibrator in a region where the second photosensitive film is removed, and (l) removing the second photosensitive film remaining in the region where the above any piezoelectric/electrostrictive film is not formed.

According to a eighth aspect of the invention, the manufacturing method of a piezoelectric/electrostrictive film type element according to any of the first to sixth aspects of the invention, further includes the steps of: (m) after the step (e), forming a second photosensitive film to overlap on any electrode film constituting the laminated vibrator on the first main surface of the substrate, (n) irradiating a light from a side of the second main surface of the substrate to selectively expose the second photosensitive film formed in a region where the above any electrode film is not formed, (o) removing an unexposed part of the second photosensitive film, (p) forming a piezoelectric/electrostrictive film constituting the laminated vibrator in a region where the second photosensitive film is removed, and (q) removing the second photosensitive film remaining in the region where the above any electrode film is not formed.

According to a ninth aspect of the invention, the manufacturing method of a piezoelectric/electrostrictive film type element according to any of the first to sixth aspects of the invention, further includes the step of: (r) after the step (e), forming a piezoelectric/electrostrictive film constituting the laminated vibrator by electrophoresis of a piezoelectric/electrostrictive material toward any electrode film constituting the laminated vibrator.

According to a tenth aspect of the invention, the manufacturing method of a piezoelectric/electrostrictive film type element according to any of the first to ninth aspects of the invention, further includes the step of: (s) after the step (c) and before the step (d), covering the first photosensitive film remaining in the region where the cavity is not formed, with a water-repellent film having higher water-repellency than the first photosensitive film.

According to an eleventh aspect of the invention, in the manufacturing method of a piezoelectric/electrostrictive film type element according to the tenth aspect of the invention, the step (s) includes the steps of: (s-1) forming a masking film on the first main surface of the substrate to overlap on the first photosensitive film remaining in the region where the cavity is not formed, (s-2) removing the masking film until the first photosensitive film remaining in the region where the cavity is not formed is exposed, (s-3) forming a water-repellent film on the first main surface of the substrate to overlap on the water-repellent film remaining in the region where the cavity is not formed and the masking film remaining in the region where the cavity is formed, and (s-4) removing the first photosensitive film remaining in the region where the cavity is formed and the masking film remaining in the region where the cavity is formed.

According to a twelfth aspect of the invention, a manufacturing method of a piezoelectric/electrostrictive film type element comprising a substrate in which a cavity is formed, and a laminated vibrator made of laminations of an electrode film and a piezoelectric/electrostrictive film provided on a first main surface of the substrate so as to position with the cavity in a plain position, the manufacturing method includes the steps of: (a) forming a first photosensitive film on the first main surface of the substrate, (b) irradiating a light from a side of a second main surface of the substrate to depict a latent image, in which a plain shape of the cavity is transferred, on the first photosensitive film, (c) removing the first photosensitive film formed in a region where the cavity is not formed, by development, (d) forming a water-repellent film on the first main surface of the substrate to overlap on the first photosensitive film remaining in a region where the cavity is formed, (e) removing the first photosensitive film remaining in the region where the cavity is formed and the water-repellent film formed in the region where the cavity is formed, (f) forming a lowermost film constituting the laminated vibrator in a region where the first photosensitive film and the water-repellent film are removed, and (g) removing the water-repellent film remaining in the region where the cavity is not formed.

According to a thirteenth aspect of the invention, the manufacturing method of a piezoelectric/electrostrictive film type element according to the twelfth aspect of the invention, further includes the step of: (h) before the step (b), filling a light shielding agent into the cavity; and wherein in the step (b), the first photosensitive film formed in the region where the cavity is not formed is selectively exposed, and in the step (c), an exposed part of the first photosensitive film is removed.

According to a fourteenth aspect of the invention, in the manufacturing method of a piezoelectric/electrostrictive film type element according to the thirteenth aspect of the invention, the light shielding agent includes a pigment.

According to a fifteenth aspect of the invention, the manufacturing method of a piezoelectric/electrostrictive film type element according to any of the twelfth to fourteenth aspects of the invention, further includes the steps of: (i) after the step (g), forming a second photosensitive film to overlap on any piezoelectric/electrostrictive film constituting the laminated vibrator on the first main surface of the substrate, (j) irradiating a light from a side of the second main surface of the substrate to selectively expose the second photosensitive film formed in a region where the any piezoelectric/electrostrictive film is not formed, (k) removing an unexposed part of the second photosensitive film, (l) forming an electrode film constituting the laminated vibrator in a region where the second photosensitive film is removed, and (m) removing the second photosensitive film remaining in the region where the above any piezoelectric/electrostrictive film is not formed.

According to a sixteenth aspect of the invention, the manufacturing method of a piezoelectric/electrostrictive film type element according to any of the twelfth to fourteenth aspects of the invention, further includes the steps of: (n) after the step (g), forming a second photosensitive film to overlap on any electrode film constituting the laminated vibrator on the first main surface of the substrate, (o) irradiating a light from a side of the second main surface of the substrate to selectively expose the second photosensitive film formed in a region where the above any electrode film is not formed, (p) removing an unexposed part of the second photosensitive film, (q) forming a piezoelectric/electrostrictive film constituting the laminated vibrator in a region where the second photosensitive film is removed, and (r) removing the second photosensitive film remaining in the region where the above any electrode film is not formed.

According to a seventeenth aspect of the invention, the manufacturing method of a piezoelectric/electrostrictive film type element according to any of the twelfth to fourteenth aspects of the invention, further includes the step of: (s) after the step (g), forming a piezoelectric/electrostrictive film constituting the laminated vibrator by electrophoresis of a piezoelectric/electrostrictive material toward any electrode film constituting the laminated vibrator.

According to the first to seventeenth aspects of the invention, since the lowermost film can be formed on a region where the cavity is formed, displacement of the cavity and the lowermost film in a plain position can be prevented.

According to the third aspect of the invention, the resolution of patterning can be improved.

According to the fifth aspect of the invention, since the difference between transmittance of a light in a region where the cavity is formed and in a region where the cavity is not formed, can be made larger, the resolution of patterning can be improved.

According to the sixth aspect of the invention, the resolution of patterning can be further improved.

According to the seventh aspect of the invention, since the electrode film can be formed on a region where the piezoelectric/electrostrictive film is formed, displacement of the piezoelectric/electrostrictive film and the electrode film in a plain position can be prevented.

According to the eighth aspect of the invention, since the piezoelectric/electrostrictive film can be formed on a region where the electrode film is formed, displacement of the electrode film and the piezoelectric/electrostrictive film in a plain position can be prevented.

According to the ninth aspect of the invention, since the piezoelectric/electrostrictive film can be formed on a region including a region where the electrode film is formed, displacement of the electrode film and the piezoelectric/electrostrictive film in a plane position can be prevented.

According to the tenth aspect of the invention, since the lowermost film can be shed by the water-repellent film, an edge part of the lowermost film can be prevented to be projected.

According to the twelfth aspect of the invention, since the lowermost film can be formed in a region where the cavity is formed, displacement of the cavity and the lowermost film in a plane position can be prevented. Also, since the lowermost film is shed by the water-repellent film, the edge part of the lowermost film can be prevented to be projected.

According to the fourteenth aspect of the invention, the resolution of patterning can be improved.

According to the fifteenth aspect of the invention, since the electrode film can be formed in a region where the piezoelectric/electrostrictive film is formed, displacement of the piezoelectric/electrostrictive film in a plane position can be prevented.

According to the sixteenth aspect of the invention, since the piezoelectric/electrostrictive film can be formed in a region where the electrode film is formed, displacement of the electrode film and the piezoelectric/electrostrictive film in a plane position can be prevented.

According to the seventeenth aspect of the invention, since the piezoelectric/electrostrictive film can be formed in a region including a region where the electrode film is formed, displacement of the electrode film and the piezoelectric/electrostrictive film in a plane position can be prevented.

These and other objects, features, aspects and advantages of the present invention will become more apparent from the following detailed description of the present invention when taken in conjunction with the accompanying drawings.

BRIEF DESCRIPTION OF DRAWINGS

FIG. 38 is a view for illustrating the method of forming the resist patterns according to the third preferred embodiment.

FIG. 39 is a view for showing a forming condition of the resist patterns and an estimation result of the formed resist patterns in examples 1 to 3, and comparative examples 1 and 2.

FIG. 41 is a view for showing the forming condition of the resist patterns and the estimation result of the formed resist patterns in an example 4.

DETAILED DESCRIPTION OF THE INVENTION

1. First Preferred Embodiment

In the first preferred embodiment, in manufacturing a piezoelectric/electrostrictive film type element comprising a substrate provided with a cavity to be a cavity, and a laminated vibrator made of a laminations of a lower electrode film, a piezoelectric/electrostrictive film, and an upper electrode film, which are provided on a surface of the substrate so as to position with the cavity in a plane position, the lower electrode film is formed by a photolithography method with the substrate having the cavity being filled with a light shielding agent as a mask. Thereafter, the piezoelectric/electrostrictive film is formed by electrophoresis of powder of a piezoelectric/electrostrictive material toward the lower electrode film, and the upper electrode film is formed by the photolithography method with the piezoelectric/electrostrictive film as a mask.

<1.1 Structure of Piezoelectric/Electrostrictive Film Type Element 1>

Figure 1:
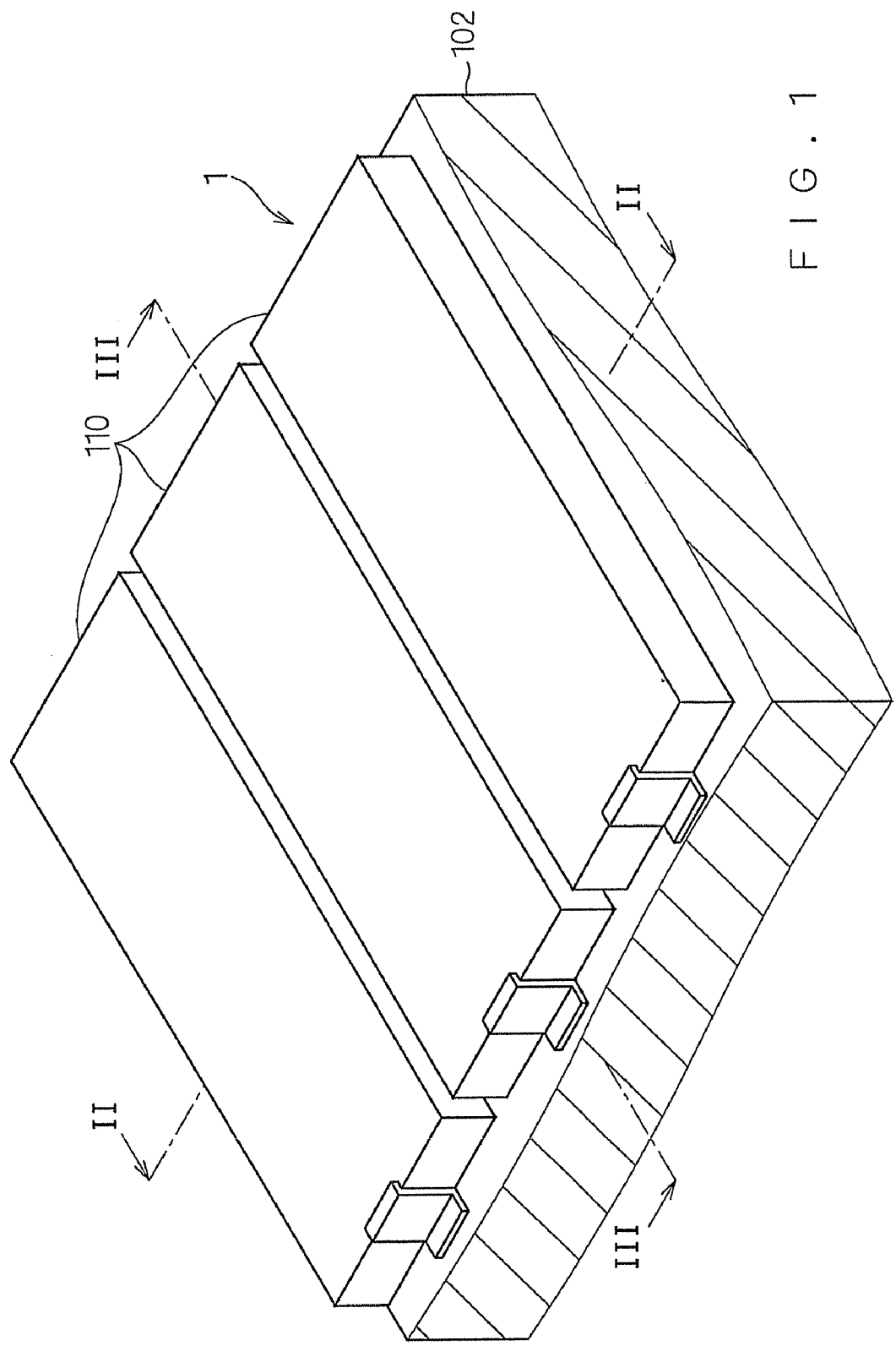
FIG. 1 is a perspective diagram for showing a structure of a piezoelectric/electrostrictive film type element manufactured by a manufacturing method of a piezoelectric/electrostrictive film type element according to a first preferred embodiment.
Figure 2:
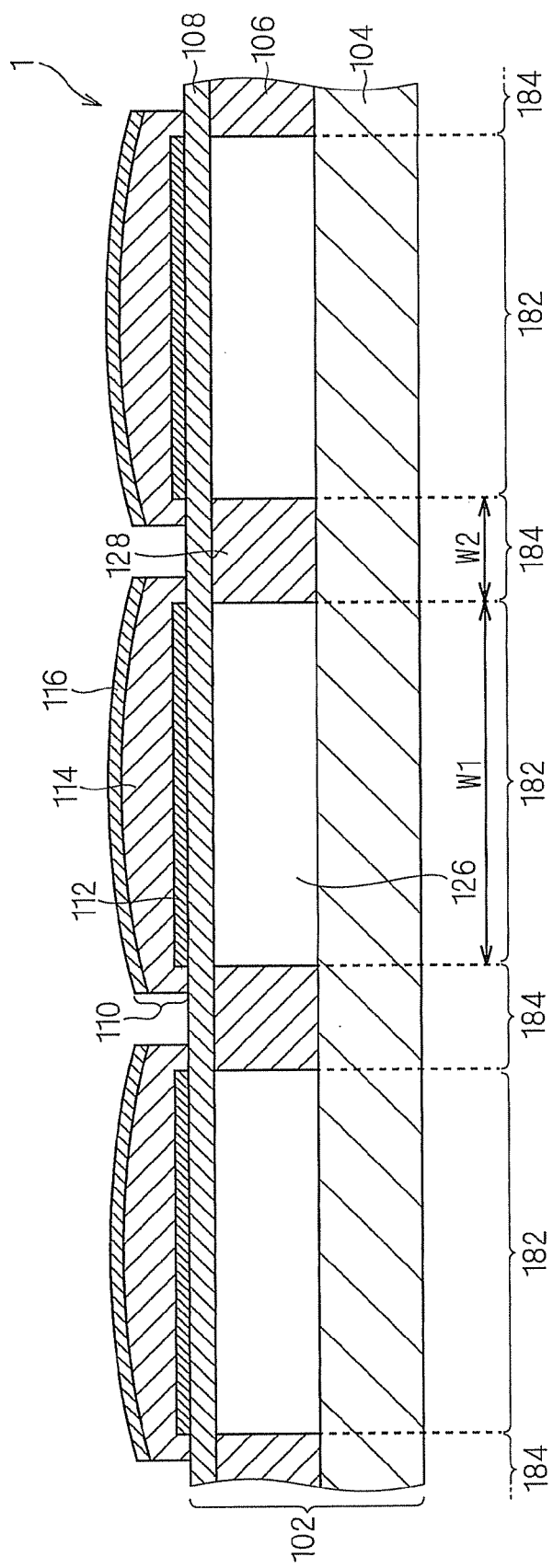
FIG. 2 is a sectional view of the piezoelectric/electrostrictive film type element along with II-II of FIG. 1.
Figure 3:
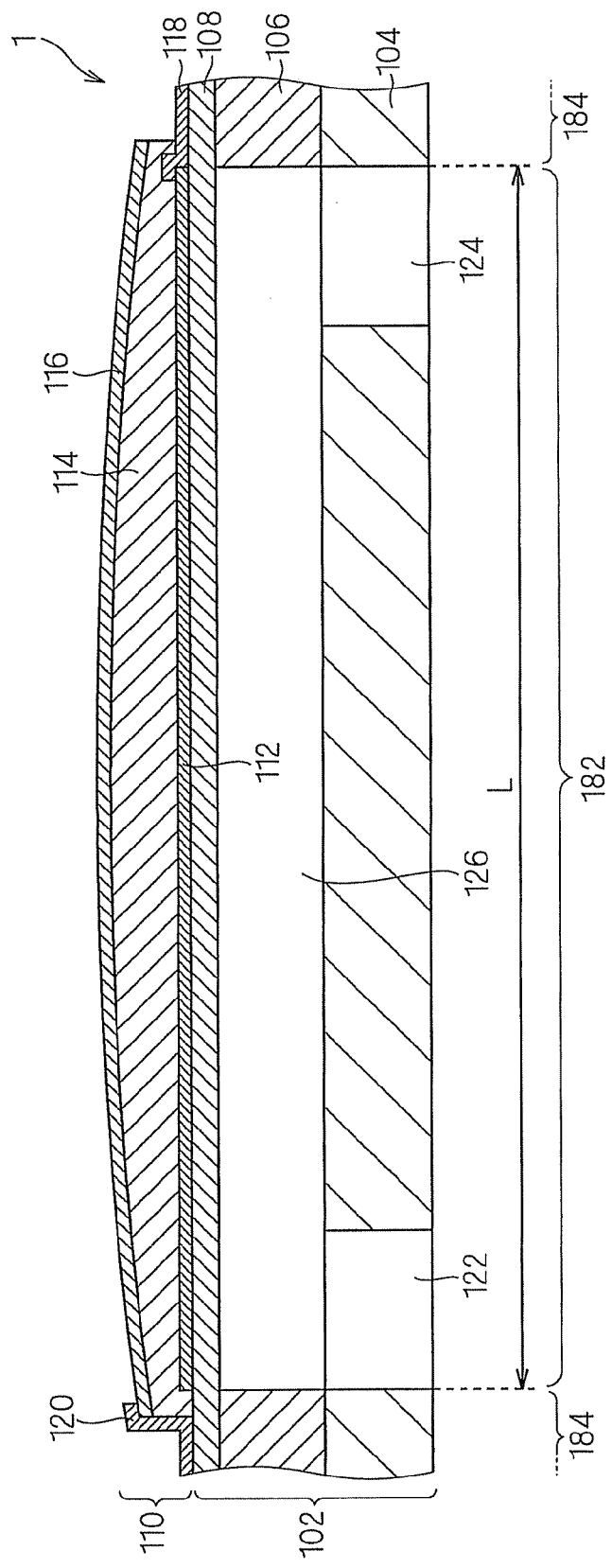
FIG. 3 is a sectional view of the piezoelectric/electrostrictive film type element along with III-III of FIG. 1.

FIGS. 1 to 3 are schematic views for showing an outline structure of a piezoelectric/electrostrictive film type element 1 manufactured by a manufacturing method of a piezoelectric/electrostrictive film type element according to the first preferred embodiment of the present invention. FIG. 1 is a perspective view of the piezoelectric/electrostrictive film type element 1, FIG. 2 is a sectional view of the piezoelectric/electrostrictive film type element 1 along with II-II of FIG. 1, and FIG. 3 is a sectional view of the piezoelectric/electrostrictive film type element 1 along with III-III of FIG. 1. The piezoelectric/electrostrictive film type element 1 constitutes a major part of a piezoelectric/electrostrictive actuator for discharging ink used in an inkjet printer head. A manufacturing method of a piezoelectric/electrostrictive film type element described below can be applied to the manufacture of other types of piezoelectric/electrostrictive film type elements.

As shown in FIGS. 1 to 3, the piezoelectric/electrostrictive film type element 1 includes a structure in which a plurality of laminated vibrators 110 are regularly arrayed on a surface of a substrate 102. The manufacturing method of the piezoelectric/electrostrictive film type element described below can be used in the manufacture of a piezoelectric/electrostrictive film type element including only one laminated vibrator 110.

As shown in FIGS. 2 and 3, the piezoelectric/electrostrictive film type element 1 has a sectional structure provided with the laminated vibrators 110, in which lower electrode films 112, piezoelectric/electrostrictive films 114, and upper electrode films 116 are laminated from bottom to top in the order mentioned, on the surface of the substrate 102 in which a base plate 104, a base plate 106, and a diaphgram 108 are laminated from bottom to top in the order mentioned.

{Substrate 102}

The substrate 102 is an insulating ceramics sintered body. There is no limitation on the type of the insulating ceramics, but in terms of heat resistance, chemical stability, and electric insulation, the insulating ceramics should preferably contain at least one component selected from the group consisting of zirconium oxide, aluminum oxide, magnesium oxide, mullite, aluminum nitride, and silicon nitride. In particular, stabilized zirconium oxide is more preferable in terms of mechanical strength and toughness. The "stabilized zirconium oxide" herein refers to zirconium oxide in which crystal phase transition is suppressed by the addition of a stabilizer, and it includes not only stabilized zirconium oxide but also partially stabilized zirconium oxide.

The base plate 104 has a structure in which ink jet holes 122 and ink supply holes 124 with a round plane configuration are formed in a plate of approximately uniform thickness. The ink jet holes 122 are formed in the proximity of one end of regions 182 in which cavities 126 described below are formed (hereinafter referred to as "cavity regions"), and the ink supply holes 124 are formed in the proximity of the other end of the cavity regions 182.

The base plate 106 has a structure in which the cavities 126 with a long, narrow rectangular plane configuration are formed in a plate of approximately uniform thickness. A width W1 in a lateral direction of the respective cavities 126 should be preferably made wide and to be not less than 50 μm in order to increase the amount of flexural displacement and excluded volume. A length L1 in a longitudinal direction of the respective cavities 126 should be preferably made short and to be 3 mm and less in order to reduce the flow resistances. A width W2 of a bar 128 between the adjacent cavities 126 should be preferably made narrow and to be 100 μm and less in order to increase the amount of flexural displacement and excluded volume.

However, this does not limit the plane configuration of the cavities 126 to be long, narrow, and rectangular. That is, the plane configuration of the cavities 126 may be polygonal such as triangular, square, or the like, and a two-dimensional form such that the entire or a part of the outline shape is in a curve such as circle, oval or the like. Also, the cavities 126 are not necessarily arrayed in one direction, but may be arrayed lattice-like in two directions perpendicular to each other, for example.

The diaphragm 108 is a plate of approximately uniform thickness. The diaphragm 108 should preferably have a thickness of 30 μm and less, and more preferably between 1 and 15 μm. This is because the thickness below this range tends to cause damage to the diaphragm 108, while the thickness above this range tends to increase the stiffness of the diaphragm 108, thus reducing the amount of flexural displacement. The diaphragm 108 is not necessarily flat, and the manufacturing method of the piezoelectric/electrostrictive film type element described below can be employed even with slight concavity and convexity, or curvature.

The cavities 126 become cavities inside the substrate 102 due to a laminated structure of the base plate 104, the base plate 106, and the diaphragm 108, and function as ink chambers for keeping ink. Also, the ink jet holes 122 are connected to the cavities 126, and function as the flow paths for ink flowing out from the cavities 126. Further, the ink supply holes 124 are connected to the cavities 126, and function as the flow paths for ink flowing into the cavities 126.

The total thickness of the base plate 104, the base plate 106, and the diaphragm 108 is determined so as to transmit enough light for exposure described below. Of course, the total thickness for transmitting enough light for exposure varies, depending on the type of the insulating ceramics or the densification of the sintered body.

{Laminated Vibrator 110}

The lower electrode films 112 and upper electrode films 116 are sintered bodies of a conductive material. There is no limitation on the type of the conductive material, but in terms of electrical resistance and heat resistance, the conductive material should preferably be a metal such as platinum, palladium, rhodium, gold, or silver; or an alloy containing such a metal as the main component. In particular, platinum with excellent heat resistance, or an alloy containing platinum as the main component is more preferable.

The lower electrode films 112 should preferably have a thickness between 0.3 and 5.0 μm, and the upper electrode films 116 should preferably have a thickness between 0.1 and 3.0 μm. This is because the thickness above this range tends to increase the stiffness of the lower electrode films 112 and upper electrode films 116, thus reducing the amount of flexural displacement, while the thickness below this range tends to increase the electrical resistances of the lower electrode films 112 and upper electrode films 116, and to disconnect the lower electrode films 112 and upper electrode films 116.

The lower electrode films 112 and upper electrode films 116 should be preferably formed to cover a region substantively contributing to the flexural displacement of the piezoelectric/electrostrictive films 114. For instance, each of the lower electrode films 112 and upper electrode films 116 should be preferably formed to include the center part of the piezoelectric/electrostrictive films 114 and to cover 80% and more of a region of an upper and a lower surface of the piezoelectric/electrostrictive films 114.

The piezoelectric/electrostrictive films 114 are sintered bodies of a piezoelectric/electrostrictive ceramics. There is no limitation on the type of the piezoelectric/electrostrictive ceramics, but in terms of electric-field-induced strains, the piezoelectric/electrostrictive ceramics should preferably be lead (Pb)-based perovskite oxide, and more preferably be lead zirconate titanate (PZT; $Pb(Zr_xTi_{1-x})O_3$), or a modified substance of lead zirconate titanate into which a simple oxide, a complex pevroskite oxide, or the like has been introduced. In particular, a solid solution of lead zirconate titanate and lead magnesium niobate ($Pb(Mg_{1/3}Nb_{2/3})O_3$) in which nickel oxide (NiO) is introduced, or a solid solution of lead zirconate titanate and lead nickel niobate ($Pb(Ni_{1/3}Nb_{2/3})O_3$) are more preferable.

The piezoelectric/electrostrictive films 114 should preferably have a thickness between 1 and 20 μm. This is because the thickness below this range tends to result in insufficient densification of the piezoelectric/electrostrictive films 114, while the thickness above this range tends to increase the shrinkage stress of the piezoelectric/electrostrictive films 114 during firing, thus requiring an increase in the thickness of the diaphragm 108.

Each of the laminated vibrators 110 further comprises a lower wiring electrode 118 to be the feeding path to the lower electrode film 112, and upper wiring electrode 120 to be the feeding path to the upper electrode film 116. One end of the lower wiring electrode 118 is between the lower electrode film 112 and the piezoelectric/electrostrictive film 114 to electrically connect to one end of the lower electrode film 112, and the other end of the lower wiring electrode 118 is located in a non-cavity region 184 outside of the cavity region 182. One end of the upper wiring electrode 120 is on the lower electrodes film 116 to electrically connect to one end of the upper electrode film 116, and the other end of the upper electrode film 116 is located in the non-cavity region 184.

The lower wiring electrode 118 and upper wiring electrode 120 are provided to feed a drive signal to a feeding point located in the non-cavity region 184 of the lower wiring electrode 118 and upper wiring electrode 120, allowing an electric field to be applied to the piezoelectric/electrostrictive film 114 without affecting flexural vibration described below.

Each of the laminated vibrators 110 is integrated with the diaphragm 108 above the cavity 126. In the configuration described above, when a drive signal is fed between the lower electrode film 112 and upper electrode film 116 via the lower wiring electrode 118 and upper wiring electrode 120 to apply an electric field to the piezoelectric/electrostrictive film 114, the piezoelectric/electrostrictive film 114 is expanded and contracted in a direction parallel to the surface of the substrate 102, which causes a bending of the united piezoelectric/electrostrictive film 114 and diaphragm 108. With this bending, ink inside the cavity 126 is discharged to outside through the ink jet hole 122.

<1.2 Manufacturing Method of Piezoelectric/Electrostrictive Film Type Element>

FIGS. 4 to 14 are schematic views for illustrating a manufacturing method of the piezoelectric/electrostrictive film type element according to the first preferred embodiment.

FIGS. 4 to 14 are sectional views of a work-in-process of the piezoelectric/electrostrictive film type element.

{Manufacture of Substrate 102}

Figure 4:
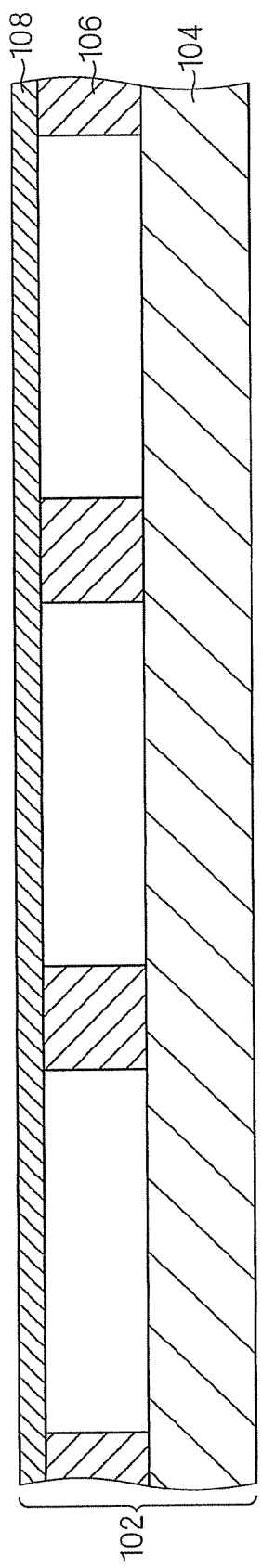
FIG. 4 is a view for illustrating the manufacturing method of the piezoelectric/electrostrictive film type element according to the first preferred embodiment.

In manufacturing the piezoelectric/electrostrictive film type element 1, first, as shown in FIG. 4, the substrate 102 is manufactured. The substrate 102 is prepared by, for example, pressing and firing green sheets of a sheeted insulating ceramics.

{Formation of Lower Electrode Film 112}

Figure 5:
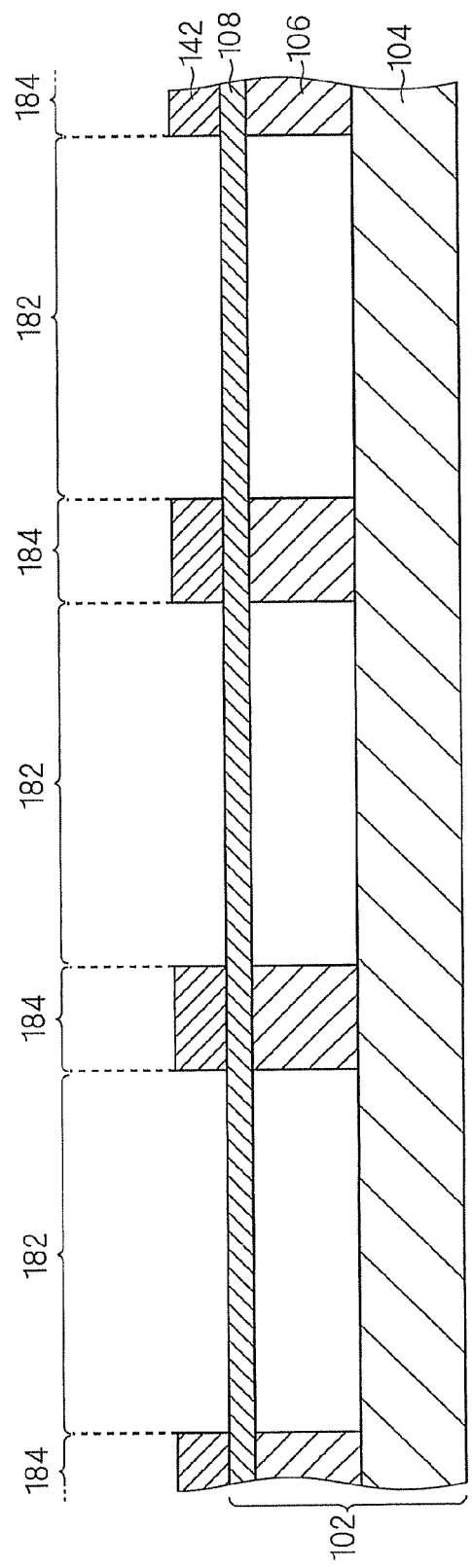
FIG. 5 is a view for illustrating the manufacturing method of the piezoelectric/electrostrictive film type element according to the first preferred embodiment.

Subsequently, as shown in FIG. 5, resist patterns 142 are formed on the surface of the substrate 102 to cover the non-cavity regions 184 and not to cover the cavity regions 182. The resist patterns 142 are formed by patterning a resist film covering the surface of the substrate 102 with the substrate 102 as a mask by a photolithography method.

Figure 6:
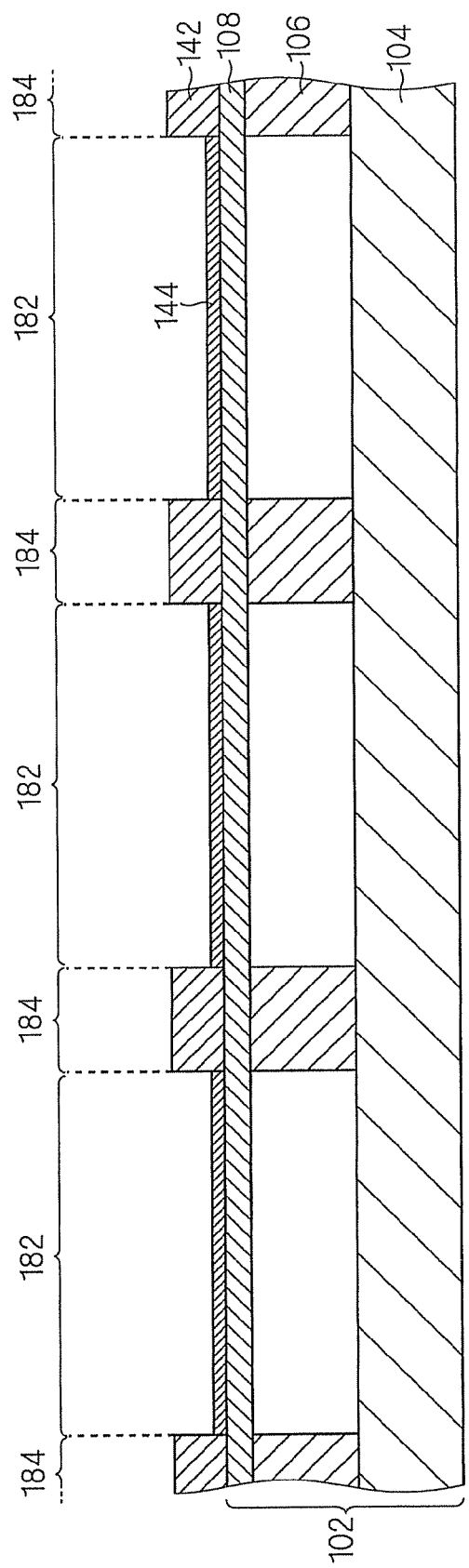
FIG. 6 is a view for illustrating the manufacturing method of the piezoelectric/electrostrictive film type element according to the first preferred embodiment.

After forming the resist patterns 142, as shown in FIG. 6, conductive material films 144 to be the lowermost lower electrode films 112 are formed on the cavity regions 182 on which the resist patterns are not formed on the surface of the substrate 102. The resist patterns 142 are removed later so that there is no problem if the conductive material films 144 protrude to the non-cavity regions 184. The conductive material films 144 may be formed by applying either a paste where a conductive material is dispersed in a dispersion medium (hereinafter, referred to as a "conductive paste") or a solution where resinate as a conductive material dissolves in a solvent (hereinafter, referred to as a "conductive resinate solution") and then by removing the dispersion medium or the solvent. Or, they may be formed by deposition of a conductive material. The application of a conductive paste is made by screen printing or any other similar technique, and the application of a conductive resinate solution is made by spin coating, spraying, or any other similar technique. The deposition of a conductive material is made by sputtering, resistance heating, or any other similar technique. The contact angle of the conductive paste to the resist patterns 142 should be preferably 50° and more, and more preferably 70° and more.

Figure 7:
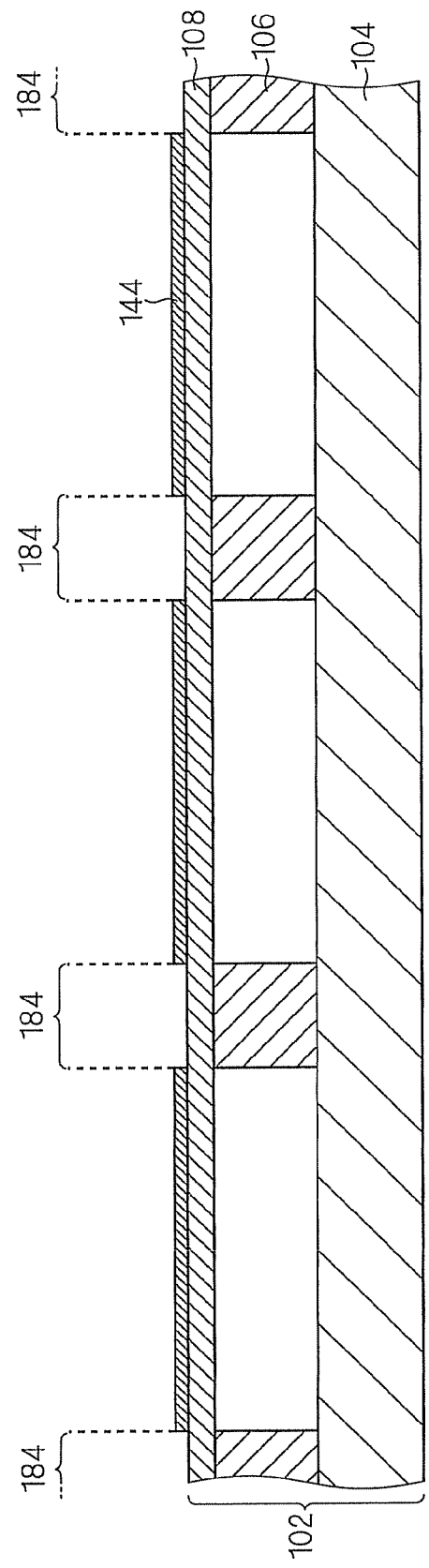
FIG. 7 is a view for illustrating the manufacturing method of the piezoelectric/electrostrictive film type element according to the first preferred embodiment.

After forming the conductive material films 144, as shown in FIG. 7, the resist patterns 142 remaining in the non-cavity regions 184 are delaminated and removed. Thereby, the conductive material films 144 having the same plane configuration as the cavities 126 are formed on the same plane position as the cavities 126. The delamination of the resist patterns 142 is made by a chemical method. Or, the delamination of the resist patterns 142 may be made by heat treatment, plasma treatment or any other similar technique, and in the case of the heat treatment, the treatment temperature should be preferably from 200 to 300° C.

Figure 8:
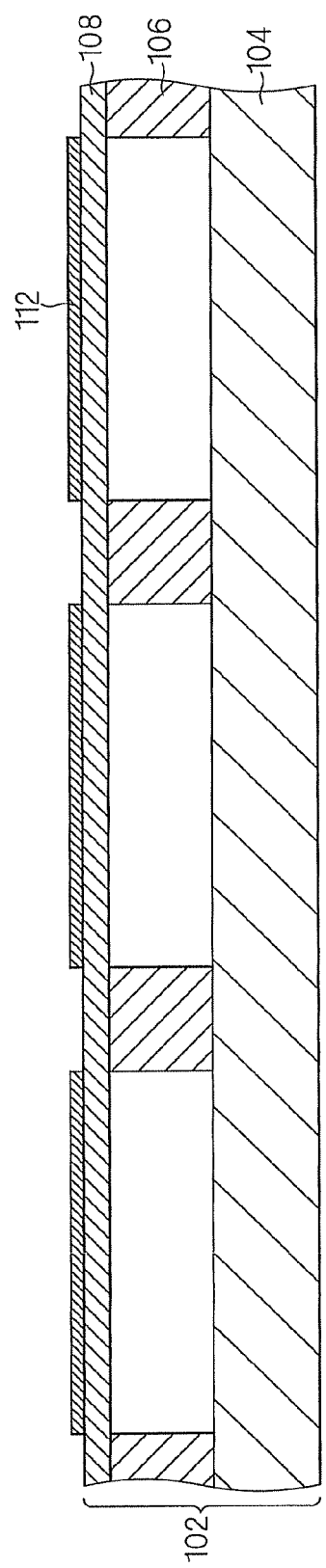
FIG. 8 is a view for illustrating the manufacturing method of the piezoelectric/electrostrictive film type element according to the first preferred embodiment.

After the delamination of the resist patterns 142, the conductive material films 144 are fired. Thereby, as shown in FIG. 8, the conductive material films 144 become the lower electrode films 112, and the lower electrode films 112 having the same plane configuration as the cavities 126 are formed on the same plane position as the cavities 126. Little shrinkage by firing is allowed. When the conductive material films 144 are formed by screen printing a conductive paste where platinum nanoparticles are dispersed in a dispersion medium, the firing temperature should be preferably between 200 and 300° C., while the conductive material films 144 are formed by screen printing a conductive paste where platinum powder is dispersed in a dispersion medium, the firing temperature should be preferably between 1000 and 1350° C. Further, when the conductive material films 144 are formed by spin coating a conductive resinate solution where platinum resinate dissolves in a solvent, the firing temperature should be preferably between 600 and 800° C.

{Formation of Lower Wiring Electrode 118}

Subsequently, the lower wiring electrode 118 is formed. The lower wiring electrode 118 may be formed by firing a conductive paste after screen printing, or by deposition of a conductive material. The lower wiring electrode 118 can be fired at the same time of firing the lower electrode films 112.

{Formation of Piezoelectric/Electrostrictive Film 114}

Figure 9:
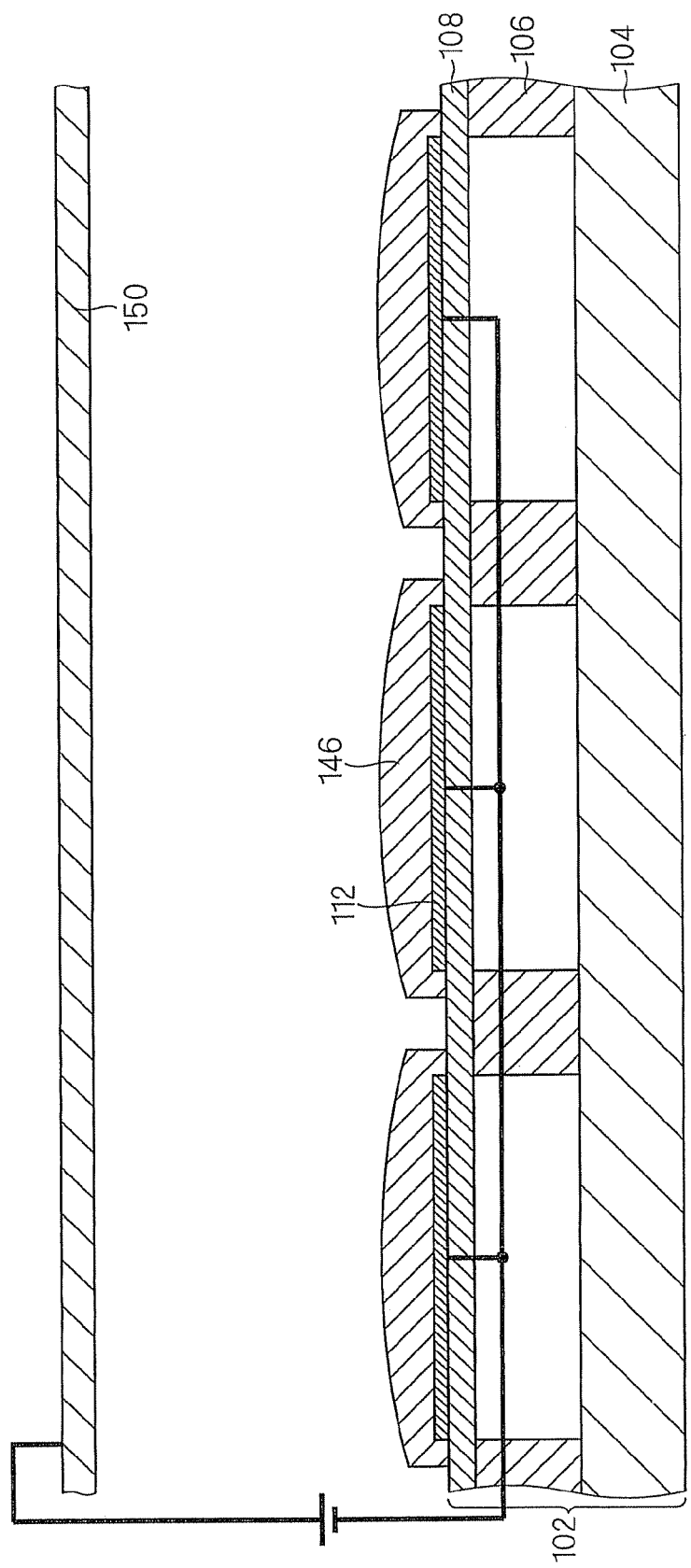
FIG. 9 is a view for illustrating the manufacturing method of the piezoelectric/electrostrictive film type element according to the first preferred embodiment.

Subsequently, as shown in FIG. 9, a piezoelectric/electrostrictive material films 146 to be the piezoelectric/electrostrictive films 114 are formed. The piezoelectric/electrostrictive material film 146 can be formed by immersing a work-in-process and a counter electrode 150 into a slurry where a piezoelectric/electrostrictive material is dispersed in a dispersion medium with intervals and applying voltage between the lower electrode films 112 and the counter electrode 150 to induce electrophoresis of the piezoelectric/electrostrictive material toward the lower electrode films 112, as shown in FIG. 9. As a result, the piezoelectric/electrostrictive material films 146 having the slightly larger plane configuration than the lower electrode films 112 are formed on the same plane position as the lower electrode films 112.

At this time, preferably, regions where there is no need to form the piezoelectric/electrostrictive material films 146, such as regions where the lower wiring electrodes 118 are formed, are masked with an organic protection film or the like, and unnecessary piezoelectric/electrostrictive materials are removed together with the organic protection film after forming the piezoelectric/electrostrictive material films 146. Thereby, the piezoelectric/electrostrictive material films 146 can be prevented to be formed on the lower wiring electrodes 118.

Figure 10:
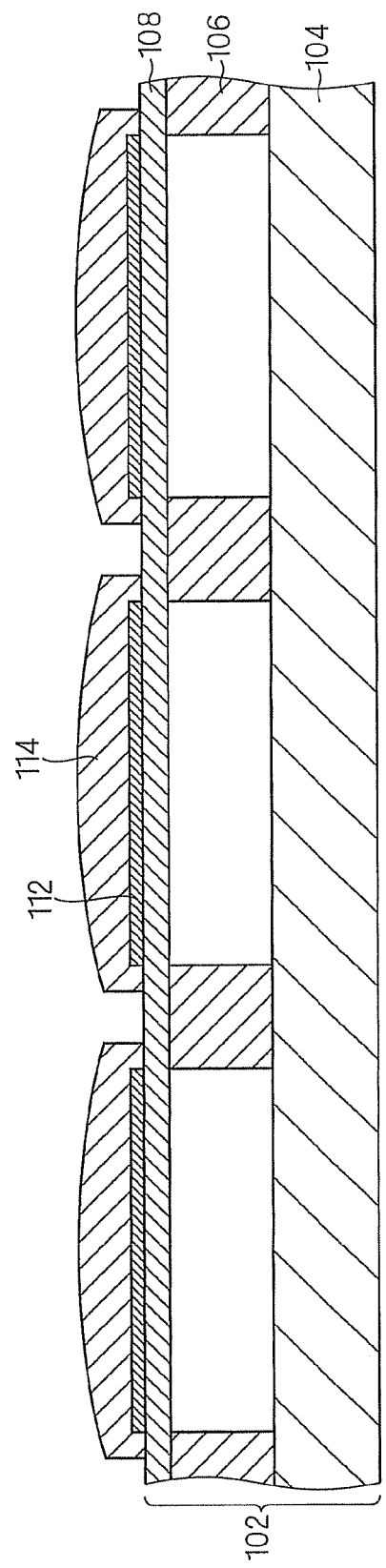
FIG. 10 is a view for illustrating the manufacturing method of the piezoelectric/electrostrictive film type element according to the first preferred embodiment.

After the piezoelectric/electrostrictive material films 146 are formed, the piezoelectric/electrostrictive material films 146 are fired. As a result, as shown in FIG. 10, the piezoelectric/electrostrictive material films 146 become the piezoelectric/electrostrictive films 114, and the piezoelectric/electrostrictive films 114 having the slightly larger plane configuration than the lower electrode films 112 are formed on the same plane position as the lower electrode films 112. Little shrinkage by firing is allowed. The piezoelectric/electrostrictive material films 146 are preferably fired in a state where the work-in-process is housed in a sleeve such as alumina, magnesia or the like.

{Formation of Upper Electrode Film 116}

Figure 11:
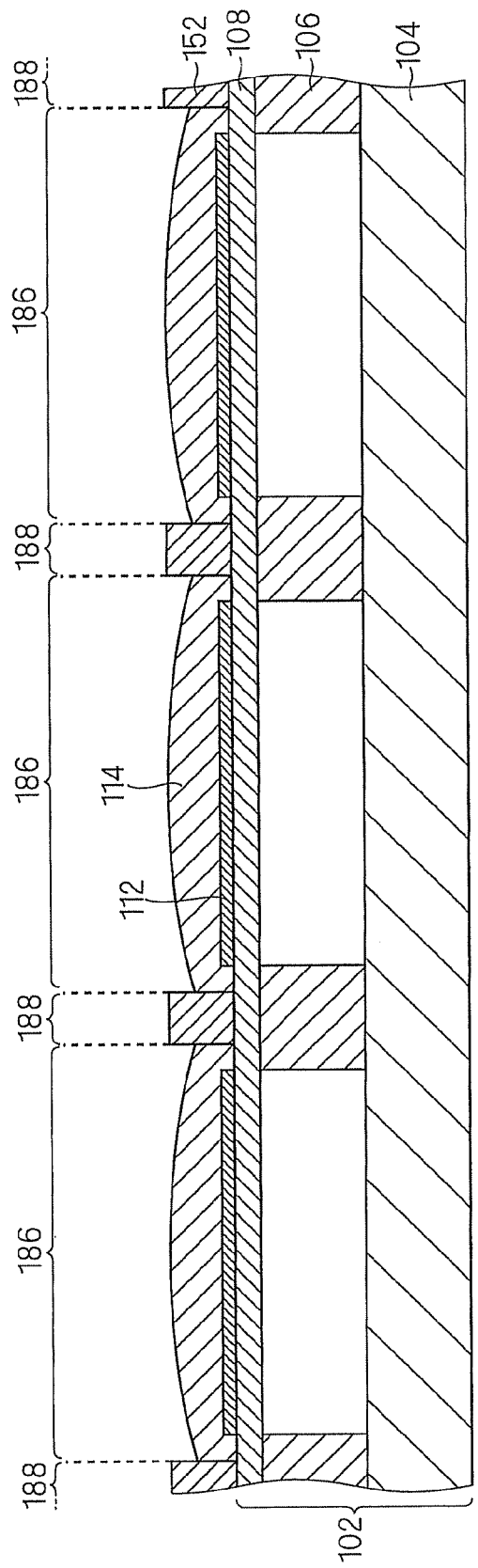
FIG. 11 is a view for illustrating the manufacturing method of the piezoelectric/electrostrictive film type element according to the first preferred embodiment.

After the piezoelectric/electrostrictive material films 146 are formed, as shown in FIG. 11, resist patterns 152 are formed on the surface of the substrate 102 not to cover regions where the piezoelectric/electrostrictive films 114 are formed (hereinafter, referred to as a "piezoelectric/electrostrictive region") 186 but to cover non-piezoelectric/electrostrictive regions 188 outside the piezoelectric/electrostrictive regions 186. The resist patterns 152 are formed by patterning a resist film covering the surface of the substrate with the piezoelectric/electrostrictive films 114 as a mask, using a photolithography method.

At this time, since the lower wiring electrodes 118 become a mask as well, the resist patterns 152 are not formed on the lower wiring electrodes 118. Accordingly, regions where there is no need to form the upper electrode films 116, such as regions where the lower wiring electrodes 118 are formed, are masked with an organic protection film, and the organic protection film is preferably removed before, after or at the same time of removing the resist patterns 152. Thereby, the upper electrode films 116 can be prevented to be formed on the lower wiring electrodes 118.

Figure 12:
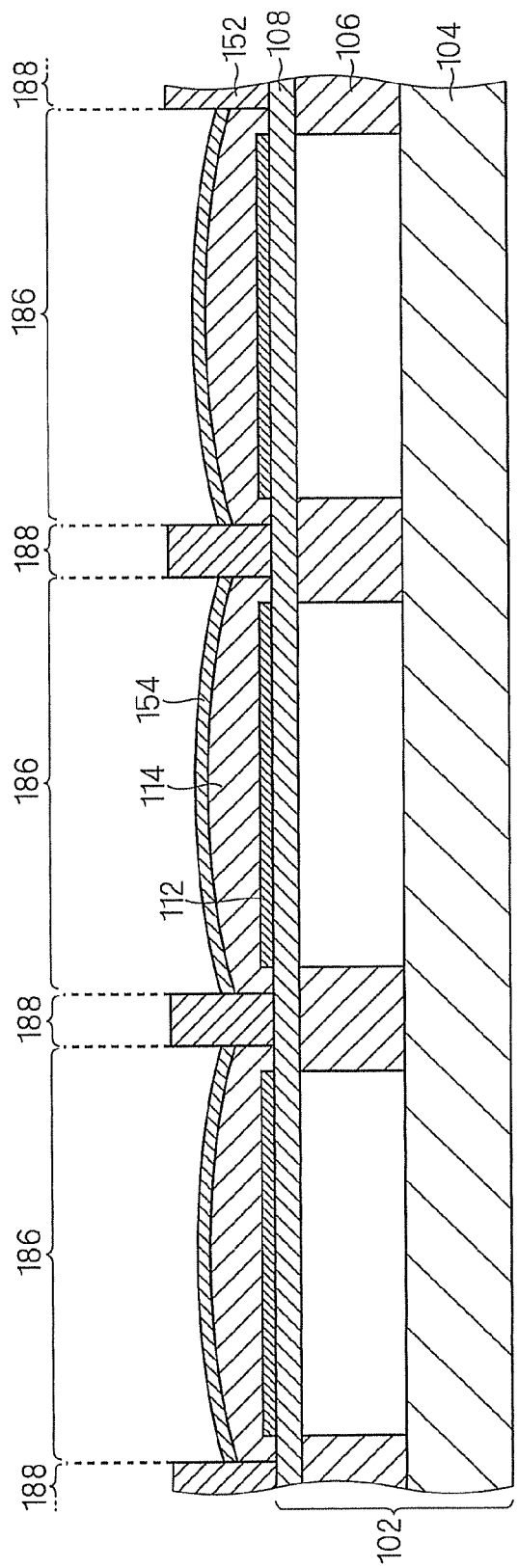
FIG. 12 is a view for illustrating the manufacturing method of the piezoelectric/electrostrictive film type element according to the first preferred embodiment.

After the resist patterns 152 are formed, as shown in FIG. 12, conductive material films 154 to be the upper electrode films 116 are formed in the piezoelectric/electrostrictive regions 186 where the resist patterns 152 are not formed on the surface of the substrate 102, to overlap on the piezoelectric/electrostrictive films 114. The resist patterns 152 are removed later so that there is no problem if the conductive material films 144 protrude to the non-piezoelectric/electrostrictive regions 188. The conductive material films 154 can be formed in the same manner as the aforementioned conductive material films 144 are formed.

Figure 13:
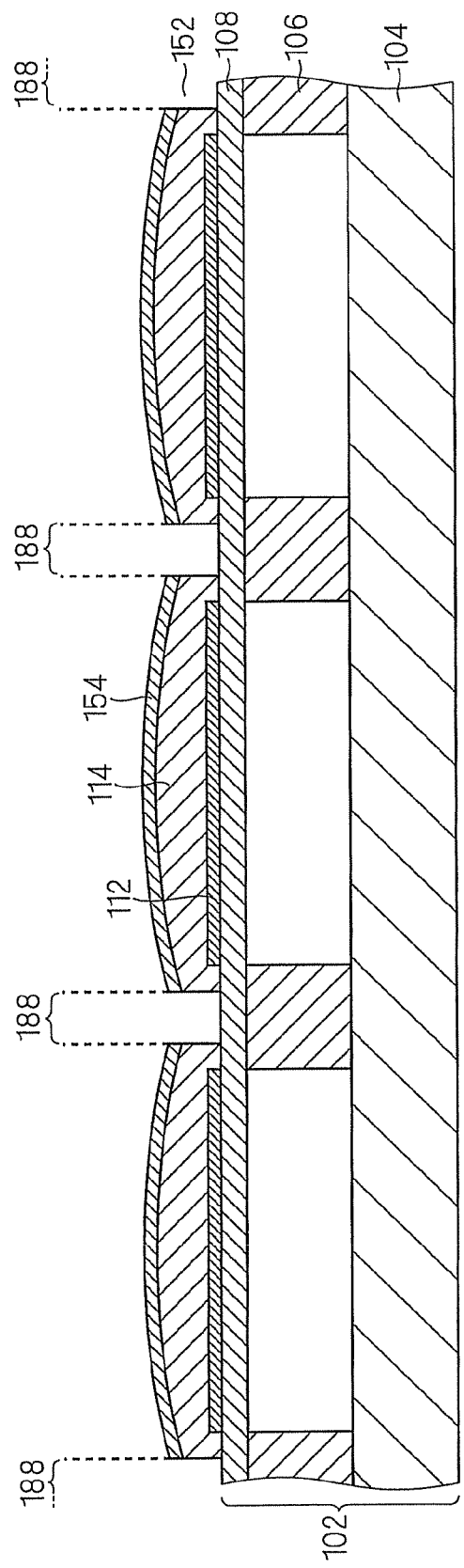
FIG. 13 is a view for illustrating the manufacturing method of the piezoelectric/electrostrictive film type element according to the first preferred embodiment.

After the conductive material films 154 are formed, as shown in FIG. 13, the resist patterns 152 remaining in the non-piezoelectric/electrostrictive regions 188 are delaminated and removed. Thereby, the conductive material films 154 having the same plane configuration as the piezoelectric/electrostrictive films 114 are formed on the same plane position as the piezoelectric/electrostrictive films 114. The resist patterns 152 can be delaminated in the same manner as the aforementioned resist patterns 142 are delaminated.

Figure 14:
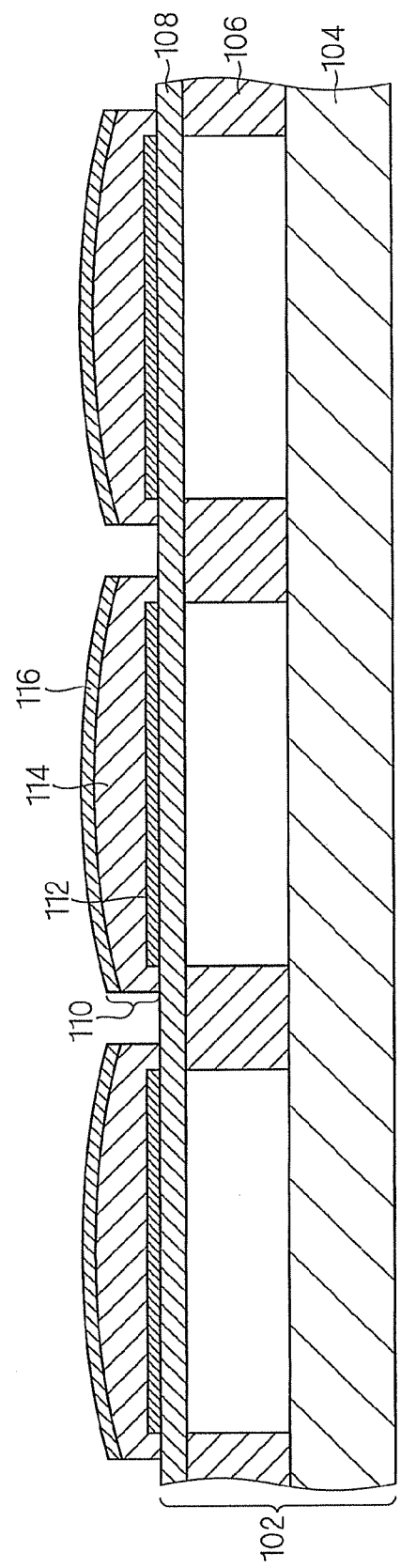
FIG. 14 is a view for illustrating the manufacturing method of the piezoelectric/electrostrictive film type element according to the first preferred embodiment.

After the delamination of the resist patterns 152, the conductive material films 154 are fired. Thereby, as shown in FIG. 14, the conductive material films 154 become the upper electrode films 116, and the upper electrode films 116 having the same plane configuration as the piezoelectric/electrostrictive films 114 are formed on the same plane position as the piezoelectric/electrostrictive films 114. Little shrinkage by firing is allowed. The conductive material films 154 can be fired in the same manner as the aforementioned conductive material films 144 are fired.

{Formation of Upper Wiring Electrode 120}

After the conductive material films 154 are formed, the upper wiring electrodes 120 are formed. The upper wiring electrodes 120 are formed in the same manner as the lower wiring electrodes 118 are formed. The upper wiring electrodes 120 can be fired at the same time as the upper electrode films 116 are fired.

According to the manufacturing method of the piezoelectric/electrostrictive film type element 1 in the above, since the lower electrode films 112 can be formed in the cavity regions 182, displacement of the cavities 126 and the lower electrode films 112 in a plane position can be prevented. Also, since the piezoelectric/electrostrictive films 114 can be formed in the piezoelectric/electrostrictive regions 186 including the cavity regions 182 where the lower electrode films 112 are formed, displacement of the lower electrode films 112 and the piezoelectric/electrostrictive films 114 in a plane position can be prevented. Further, since the upper electrode films 116 can be formed in the piezoelectric/electrostrictive regions 186, displacement of the piezoelectric/electrostrictive films 114 and the upper electrode films 116 in a plane position can be prevented. Thereby, displacement of the cavities 126, the lower electrode films 112, the piezoelectric/electrostrictive films 114, and the upper electrode films 116 constituting the laminated vibrators 110 in a plane position can be prevented, and as a result, displacement of the cavities 126 and the laminated vibrators 110 in a plane position can be prevented. This contributes to suppress variations of the ink discharging amount of a piezoelectric/electrostrictive actuator constituted to include the piezoelectric/electrostrictive film type element 1.

<1.3 Method of Forming Resist Patterns 142>

FIGS. 15 to 20 are schematic views for illustrating a method of forming the resist patterns 142 according to the first preferred embodiment. FIGS. 15 to 20 are sectional views of a work-in-progress of the piezoelectric/electrostrictive film type element 1.

Figure 15:
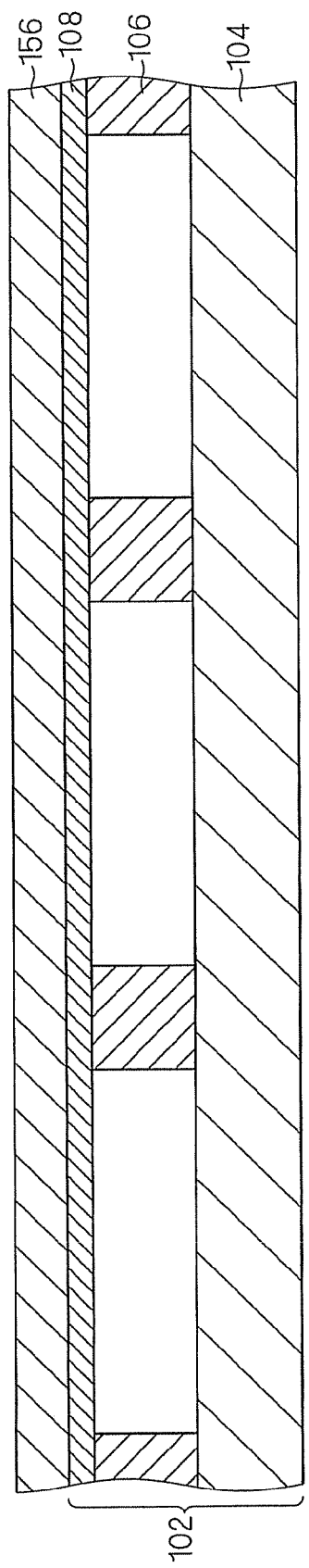
FIG. 15 is a view for illustrating a method of forming resist patterns according to the first preferred embodiment.

In forming the resist patterns 142, as shown in FIG. 15, a resist film 156 is formed on a main (i.e., first) surface of the substrate 102. The resist film 156 is formed by applying a resist solution, where a solid resist dissolves in a solvent, or is dispersed in a dispersion medium, with a spin coater on the surface of the substrate 102, and evaporating the solvent from a coating film by heating the work-in-process with a hot plate, an oven or the like. Of course, the resist solution may be applied by any other techniques such as spraying. As for a resist, a negative type in which the solubility to a developer decreases when being exposed to a light is used. Accordingly, the resist film 156 is a photosensitive film in which the solubility to a developer decreases when being exposed to a light. As for a resist, it is preferable to use a thick film compliant product applicable for forming a thick film for the resist, and more preferable to use a high aspect ratio compliant product in which a cross-sectional shape of a pattern is less likely to be tapered even if forming a pattern of the high aspect ratio.

Figure 16:
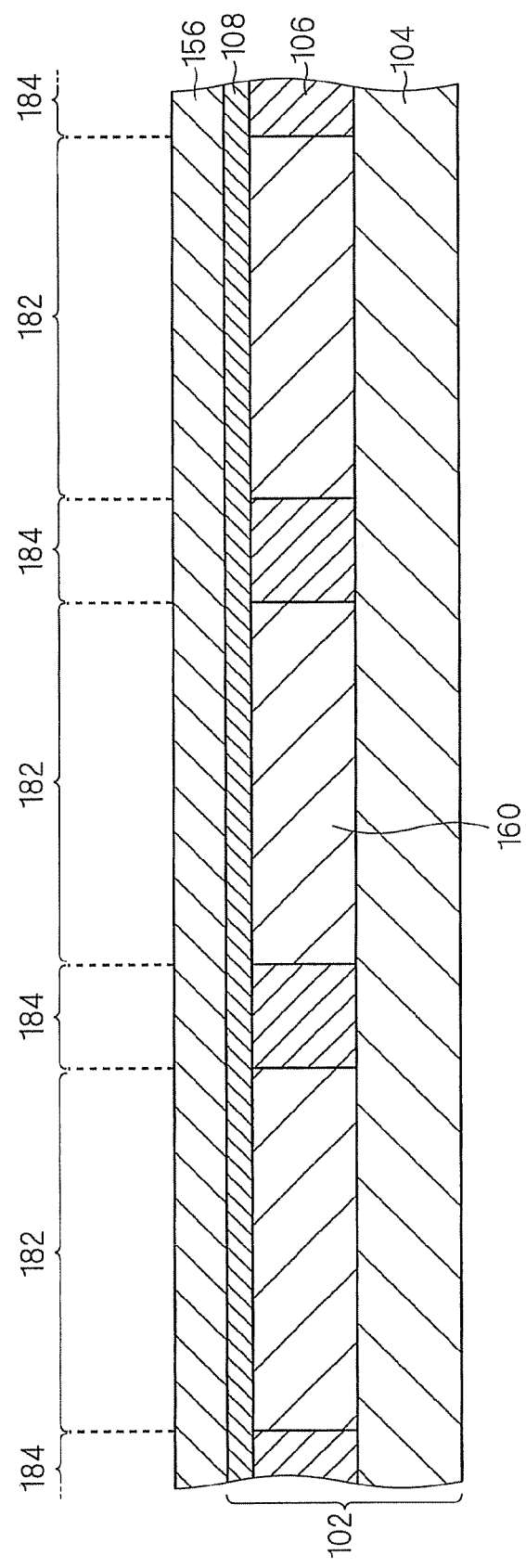
FIG. 16 is a view for illustrating the method of forming the resist patterns according to the first preferred embodiment.

After forming the resist film 156, as shown in FIG. 16, the cavities 126 are filled with a light shielding agent 160 to provide the substrate 102 with a function of a mask which shields the cavity regions 182 and does not shield the non-cavity regions 184. It is only adequate to fill the light shielding agent 160 into the cavities 126 before a light is irradiated from a back surface described below. Accordingly, the resist film 156 may be formed on the surface of the substrate 102 after filling the light shield agent 160 into the cavities 126. A filling of the light shielding agent 160 into the cavities 126 is performed by injecting a light shielding solution, where a solid portion of the light shielding agent 160 dissolves in a solvent, or is dispersed in a dispersion medium, into the ink jet holes 122 or the ink supply holes 124 with an injector, and drying the light shielding solution by heating the work-in-process with a hot plate, an oven or the like. Alternatively, instead of the injection with the injector, a porous material such as a sintered metal in which the light shielding solution is impregnated is brought into contact with the back surface of the substrate 102 to move the light shielding solution from the porous material to the cavities 126 by a capillary action. Also, a vacuum defoaming may be performed after injecting the light shielding solution. The light shielding agent 160 should preferably include a dye or a pigment absorbing a light for exposure, and it is particularly preferable to include the pigment. This is because when the light shielding agent 160 includes the pigment, the resolution of patterning can be improved. Also, the light shielding agent 160 in which a refractive index is different from the substrate 102 may be used to induce a total internal reflection of a light for exposure in the cavity regions 182.

Figure 17:
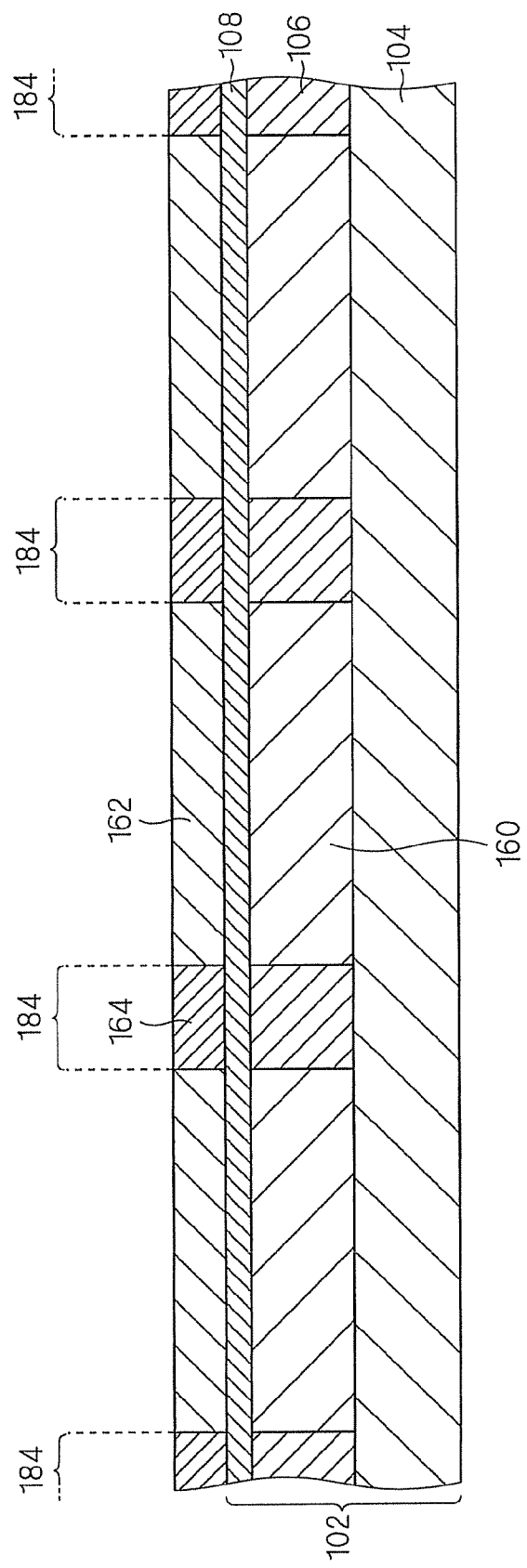
FIG. 17 is a view for illustrating the method of forming the resist patterns according to the first preferred embodiment.

After the resist film 156 is formed, and the light shielding agent 160 is filled into the cavities 126, as shown in FIG. 17, a light is irradiated from the back (i.e., second) surface of the substrate 102, selectively exposing the resist film 156 formed in the non-cavity regions 184 to form unexposed parts 162 and exposed parts 164. Thereby, a latent image in which a plane configuration of the cavities 126 is reversely transferred is and depicted on the resist film 156.

Figure 18:
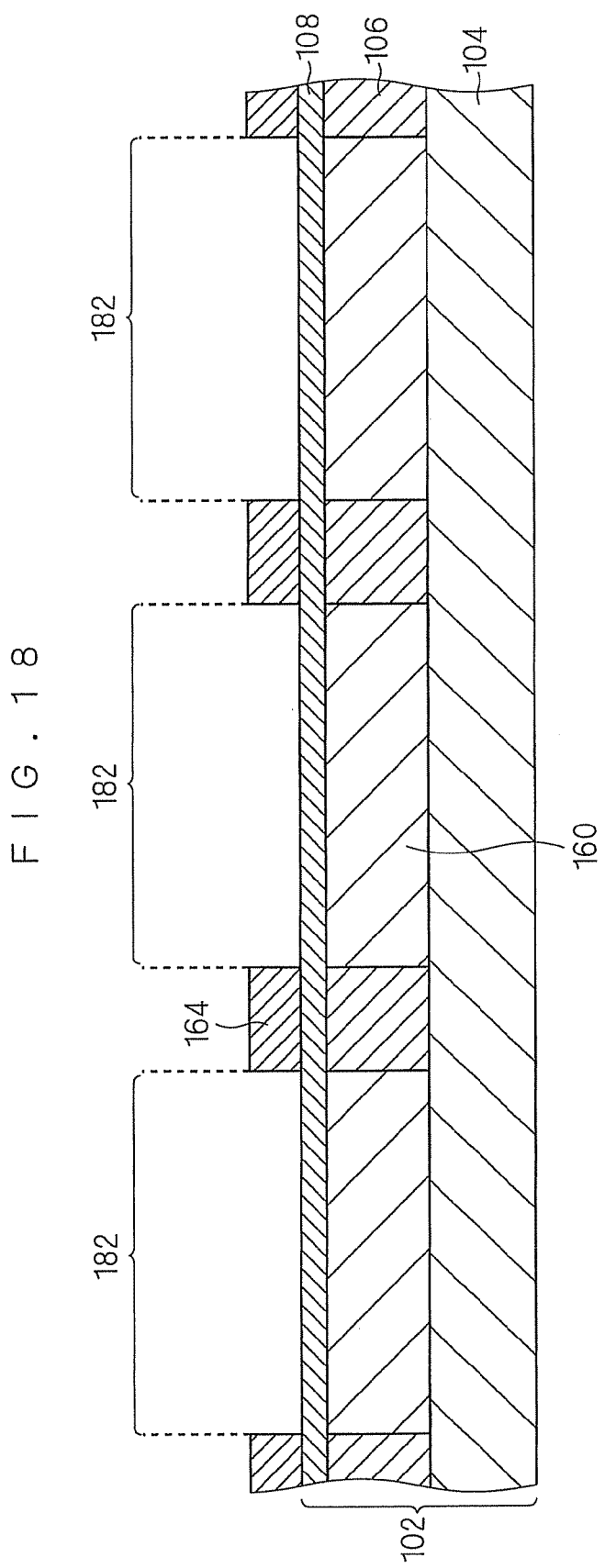
FIG. 18 is a view for illustrating the method of forming the resist patterns according to the first preferred embodiment.

After the latent image is depicted, as shown in FIG. 18, the unexposed parts 162 of the resist film 156 are removed by development. The development of the latent image is performed by immersing and oscillating the work-in-process in the developer to remove the unexposed parts 162, and thereafter cleansing the work-in-process with purified water or the like. The developer is selected to selectively dissolve the unexposed parts 162 and not to dissolve the exposed parts 164.

Figure 19:
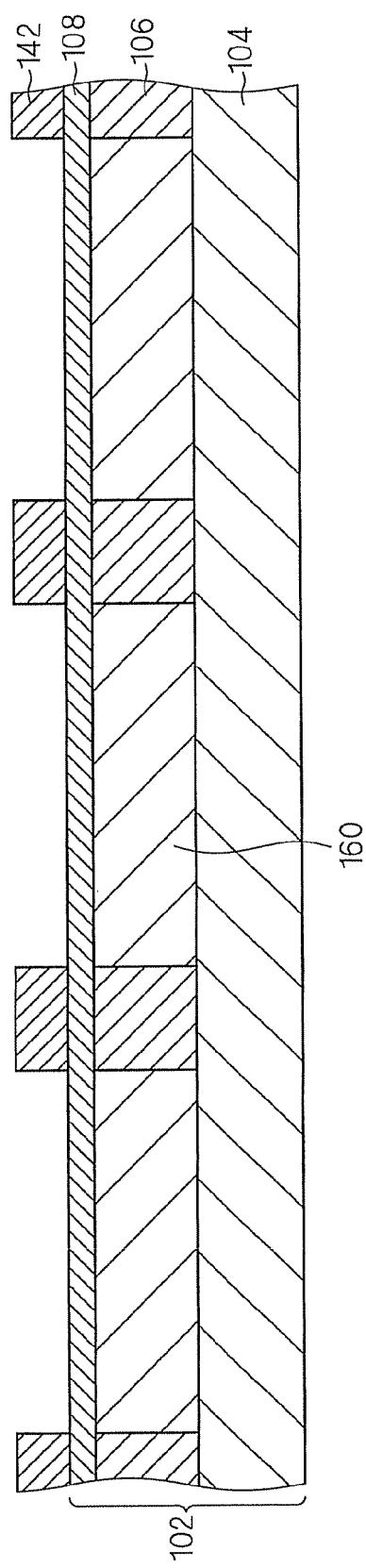
FIG. 19 is a view for illustrating the method of forming the resist patterns according to the first preferred embodiment.

After developing the latent image, a light is irradiated to form the surface of the substrate 102 and to further expose the exposed parts 164 remaining in the non-cavity regions 184, baking the exposed parts 164. As a result, as shown in FIG. 19, resist patterns 142 are completed.

Figure 20:
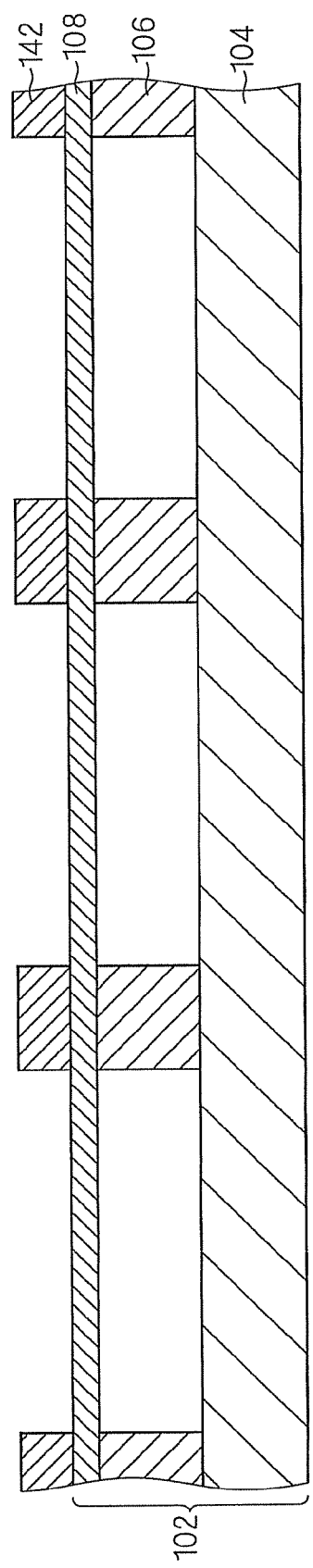
FIG. 20 is a view for illustrating the method of forming the resist patterns according to the first preferred embodiment.

After the resist patterns 142 are completed, as shown in FIG. 20, the light shielding agent 160 is removed from the cavities 126. It is only adequate to remove the light shielding agent 160 from the cavities 126 after irradiating a light from the back surface described above. Accordingly, the unexposed parts 162 may be removed after the light shielding agent 160 is removed from the cavities 126. The light shielding agent 160 is removed from the cavities 126 by immersing the work-in-process in a solvent.

<1.4 Method of Forming Resist Patterns 152>

FIGS. 21 to 24 are schematic views for illustrating a method of forming resist patterns 152 according to the first preferred embodiment. FIGS. 21 to 24 are sectional views of the work-in-process of the piezoelectric/electrostrictive film type element 1.

Figure 21:
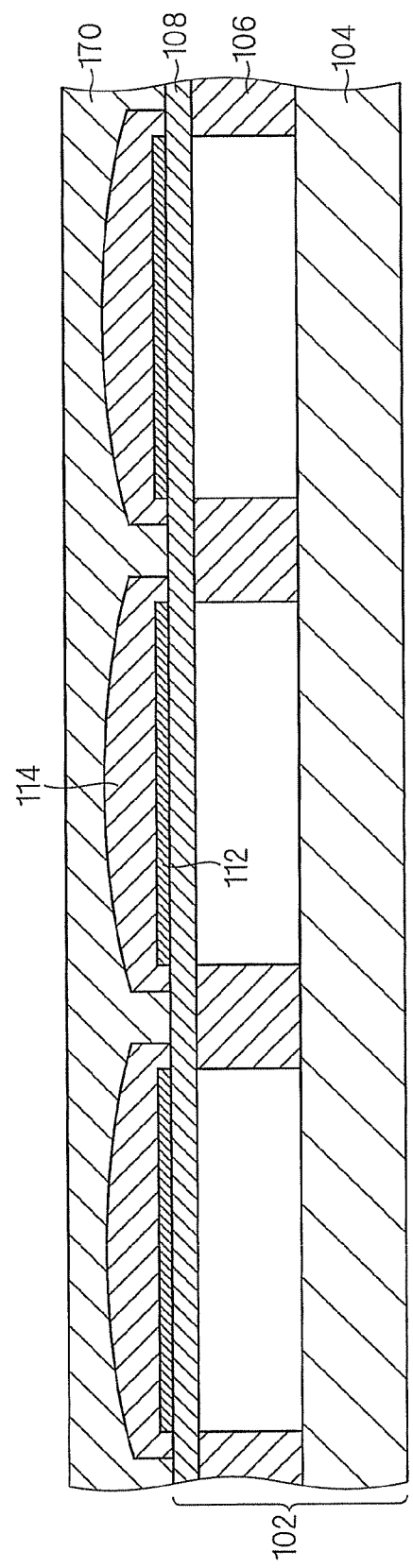
FIG. 21 is a view for illustrating the method of forming the resist patterns according to the first preferred embodiment.

In forming the resist patterns 152, as shown in FIG. 21, a resist film 170 is formed on the surface of the substrate 102 to overlap on the piezoelectric/electrostrictive films 114. The resist film 170 is formed in the same manner as the resist film 156 is formed, the similar resist used for forming the resist film 156 can be used.

Figure 22:
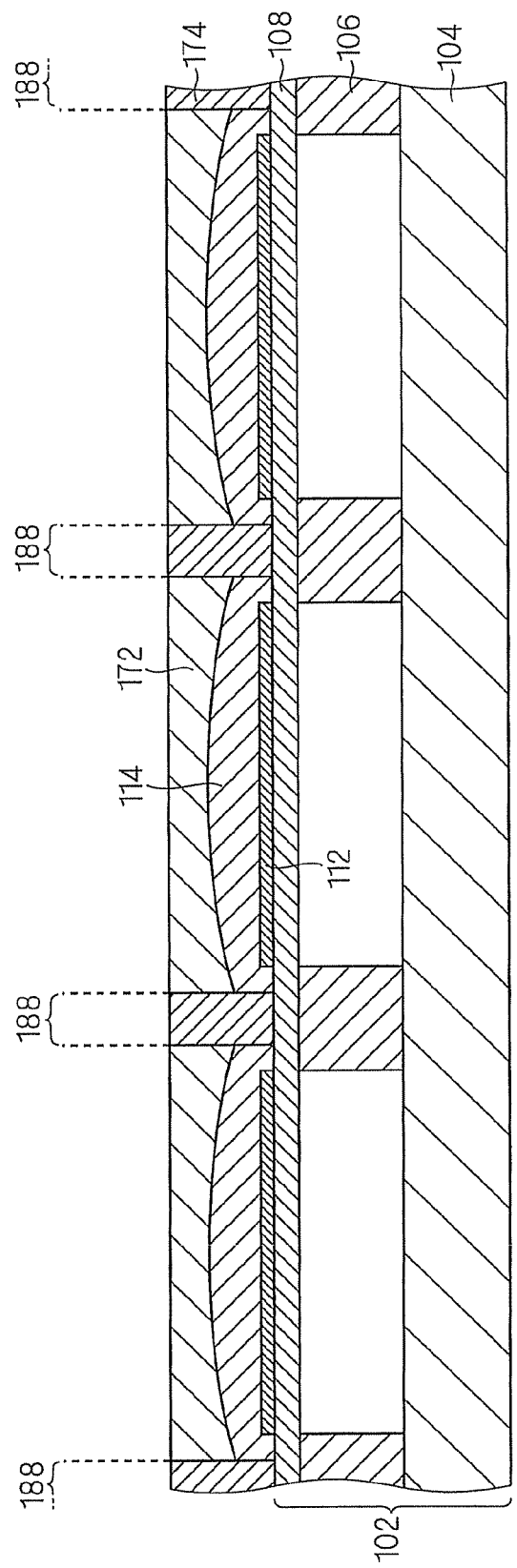
FIG. 22 is a view for illustrating the method of forming the resist patterns according to the first preferred embodiment.

After forming the resist film 170, as shown in FIG. 22, a light is irradiated from the back surface of the substrate 102 to selectively expose the resist film 170 formed on the non-piezoelectric/electrostrictive regions 188, forming unexposed parts 172 and exposed parts 174. Thereby, a latent image in which a plane configuration of the piezoelectric/electrostrictive films 114 is reversely transferred is depicted on the resist film 170.

Figure 23:
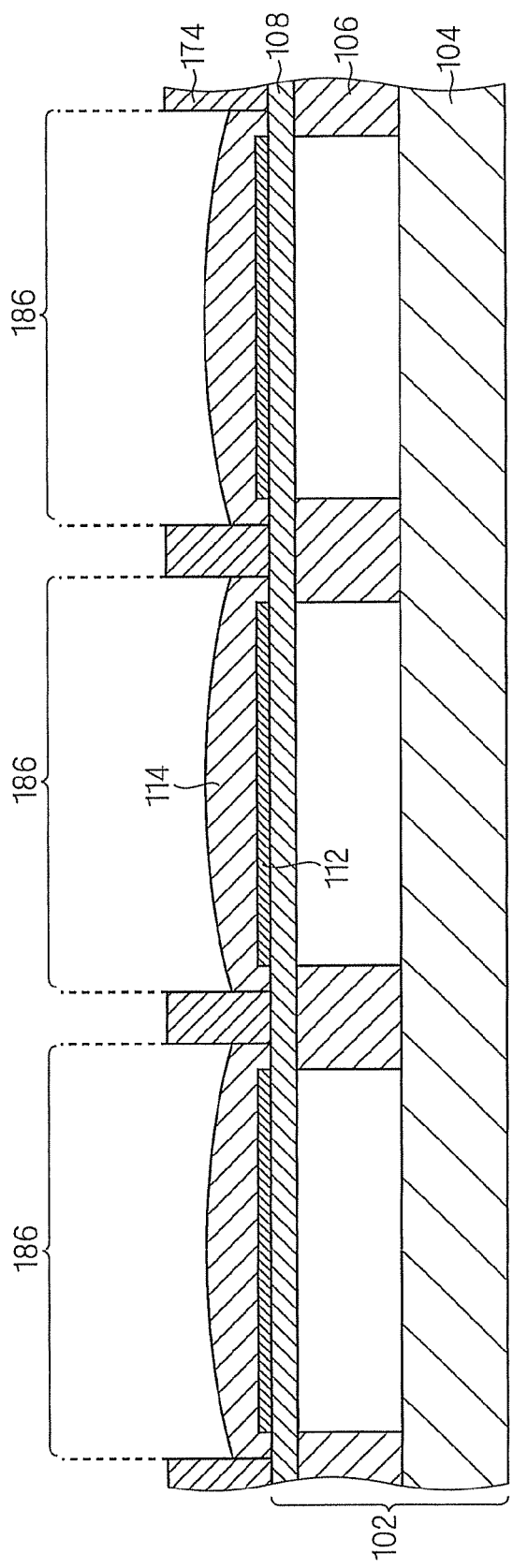
FIG. 23 is a view for illustrating the method of forming the resist patterns according to the first preferred embodiment.

After the latent image is depicted, as shown in FIG. 23, the unexposed parts 172 of the resist film 170 formed on the piezoelectric/electrostrictive regions 186 are removed by development. The development of the latent image is performed in the same manner as the development of the latent image depicted on the resist film 156, and the similar developer used for the latent image depicted on the resist film 156 can be used.

Figure 24:
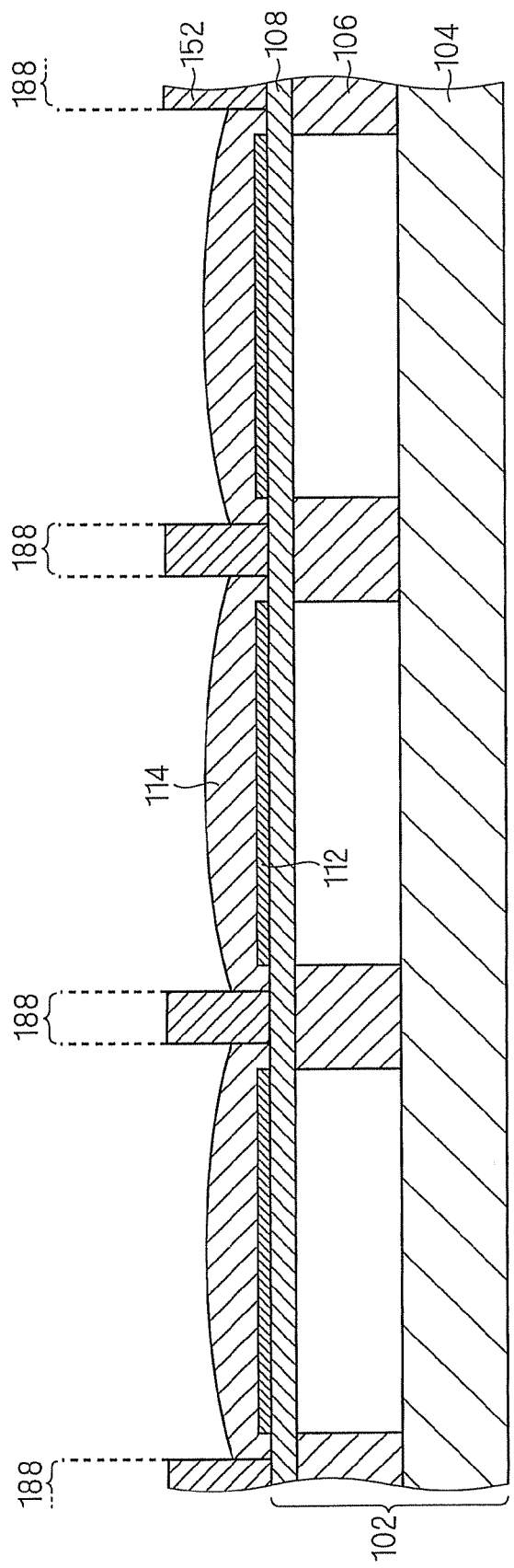
FIG. 24 is a view for illustrating the method of forming the resist patterns according to the first preferred embodiment.

After developing the latent image, a light is irradiated to form the surface of the substrate 102 and to further expose the exposed parts 174 remaining in the non-piezoelectric/electrostrictive regions 188, baking the exposed parts 174. As a result, as shown in FIG. 24, the resist patterns 152 are completed.

Second Preferred Embodiment

The second preferred embodiment relates to a method of forming a piezoelectric/electrostrictive films 214 employed instead of the method of forming the piezoelectric/electrostrictive films 114 according to the first preferred embodiment. In the method of forming the piezoelectric/electrostrictive films 214 in the second preferred embodiment, the piezoelectric/electrostrictive films 214 are formed by a photolithography method with the lower electrode films 112 as a mask.

<2.1 Method of Forming Piezoelectric/Electrostrictive films 214>

FIGS. 25 to 28 are schematic views for illustrating the method of forming the piezoelectric/electrostrictive films 214 according to the second preferred embodiment. FIGS. 25 to 28 are sectional views of the work-in-process of the piezoelectric/electrostrictive film type element.

Figure 25:
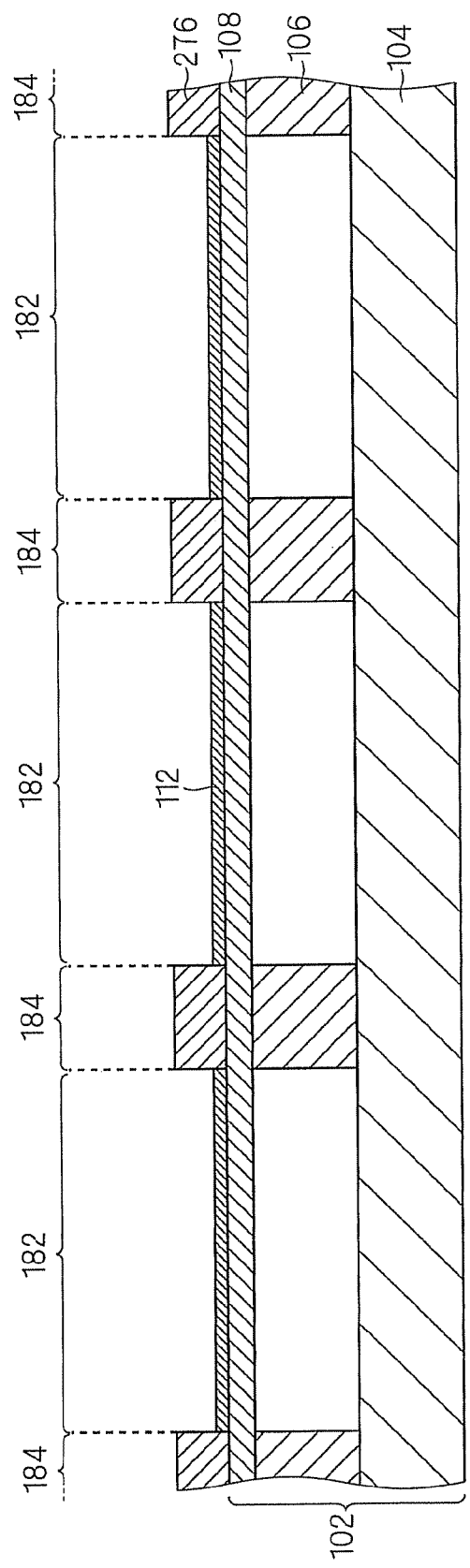
FIG. 25 is a view for illustrating a method of forming piezoelectric/electrostrictive films according to a second preferred embodiment.

In forming the piezoelectric/electrostrictive films 214, as shown in FIG. 25, first, resist patterns 276 not covering the cavity regions 182 but covering the non-cavity regions 184 are formed on the surface of the substrate 102. The resist patterns 276 are formed by patterning a resist film covering the surface of the substrate 102 with the lower electrode films 112 as a mask.

Figure 26:
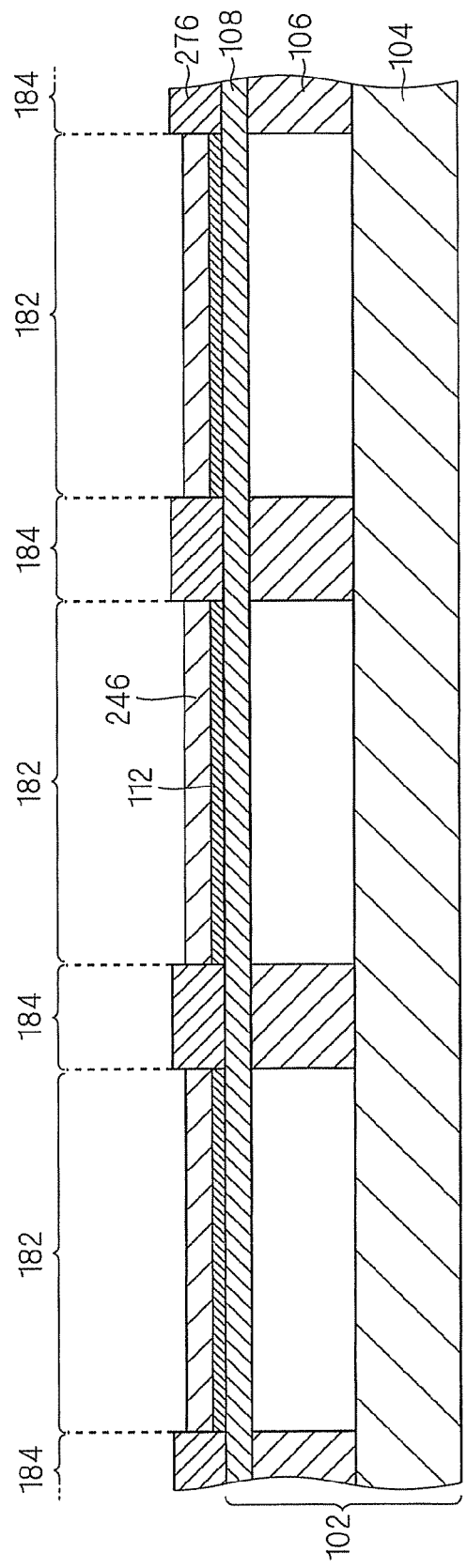
FIG. 26 is a view for illustrating the method of forming the piezoelectric/electrostrictive films according to the second preferred embodiment.

After the resist patterns 276 are formed, as shown in FIG. 26, piezoelectric/electrostrictive material films 246 to be piezoelectric/electrostrictive films 206 are formed in the cavity regions 182 where the resist patterns 276 are not formed on the surface of the substrate 102 to overlap on the lower electrode films 112. Since the resist patterns 276 are removed later so that there is no problem if the piezoelectric/electrostrictive material films 246 protrude to the non-cavity regions 184. The piezoelectric/electrostrictive material films 246 may be formed by applying a paste where a piezoelectric/electrostrictive material is dispersed in a dispersion medium (hereinafter, referred to as a "piezoelectric/electrostrictive paste") and then removing the dispersion medium or the solvent. The application of the piezoelectric/electrostrictive paste is made by screen printing or any other similar technique. The contact angle of the piezoelectric/electrostrictive paste to the resist patterns 276 should be preferably 50° and more, and more preferably 70° and more.

Figure 27:
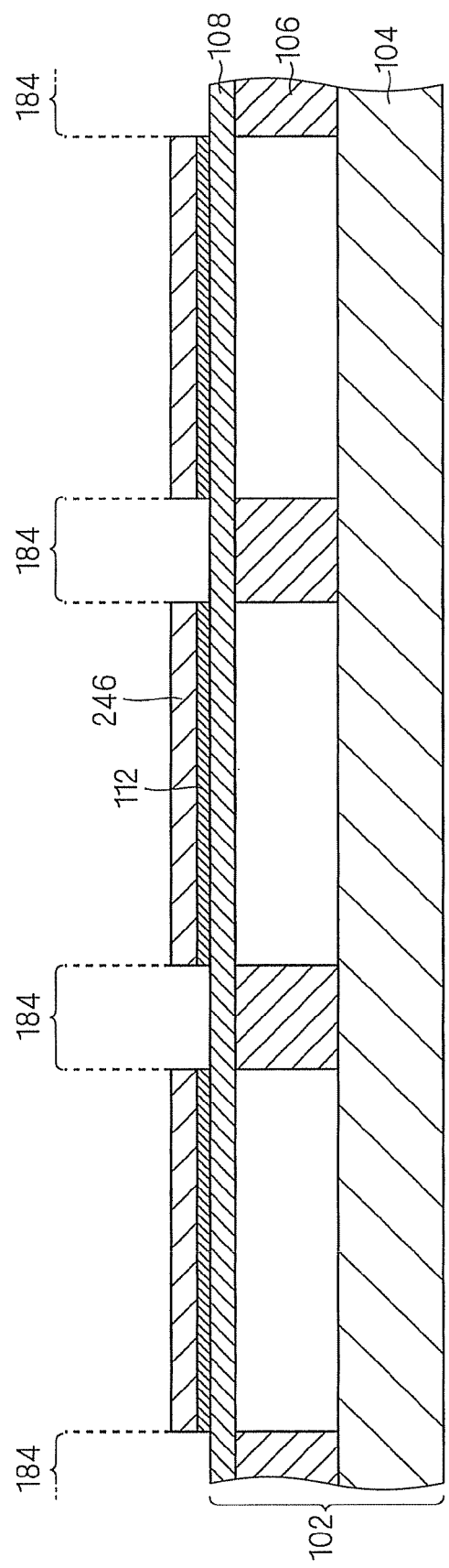
FIG. 27 is a view for illustrating the method of forming the piezoelectric/electrostrictive films according to the second preferred embodiment.

After the piezoelectric/electrostrictive material films 246 are formed, as shown in FIG. 27, the resist patterns 276 remaining in the non-cavity regions 184 are delaminated and removed. Thereby, the piezoelectric/electrostrictive material films 246 having the same plane configuration as the lower electrode films 112 are formed on the same plane position as the lower electrode films 112. The delamination of the resist patterns 276 is made in the same manner as the delamination of the resist patterns 142 described above.

Figure 28:
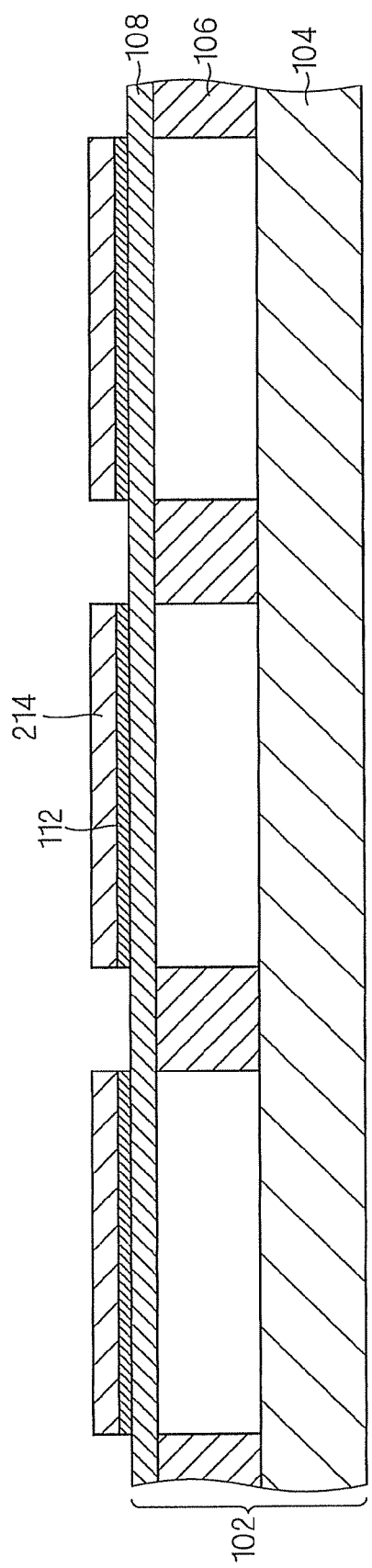
FIG. 28 is a view for illustrating the method of forming the piezoelectric/electrostrictive films according to the second preferred embodiment.

After the delamination of the resist patterns, the piezoelectric/electrostrictive material films 246 are fired. Thereby, as shown in FIG. 28, the piezoelectric/electrostrictive material films 246 become piezoelectric/electrostrictive films 214, and the piezoelectric/electrostrictive films 214 having the same plane configuration as the lower electrode films 112 are formed on the same plane position as the lower electrode films 112. Little shrinkage by firing is allowed. The piezoelectric/electrostrictive material films 246 are fired in the same manner as the piezoelectric/electrostrictive material films 146 described above.

According to the method of forming the piezoelectric/electrostrictive films 214 in the above, since the piezoelectric/electrostrictive films 214 can be formed in the cavity regions 182 where the lower electrode films 112 are formed, displacement of the lower electrode films 112 and the piezoelectric/electrostrictive films 214 in a plane position can be prevented, and the piezoelectric/electrostrictive films 214 can function equally to the piezoelectric/electrostrictive films 114 according to the first preferred embodiment.

<2.2 Method of Forming Resist Patterns 276>

FIGS. 29 to 32 are schematic views for illustrating the method of forming the resist patterns 276 according to the second preferred embodiment. FIGS. 29 to 32 are sectional views of the work-in-process of the piezoelectric/electrostrictive film type element.

Figure 29:
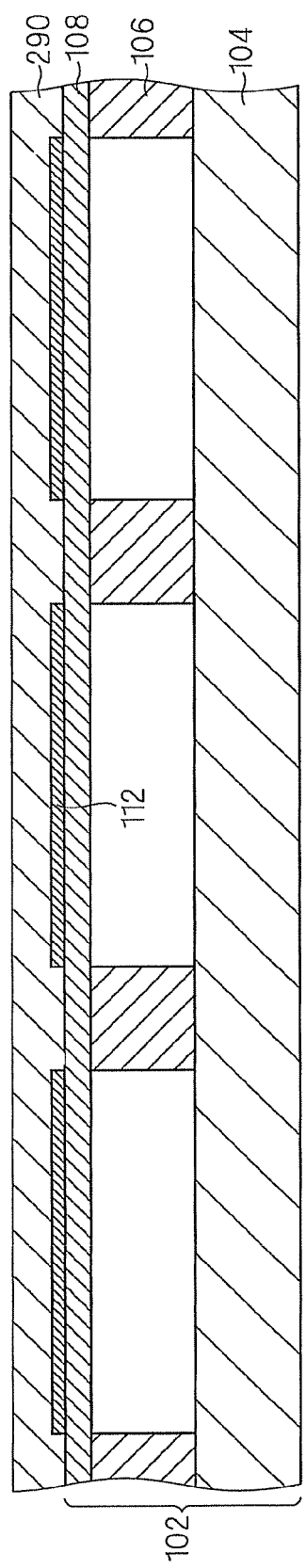
FIG. 29 is a view for illustrating the method of forming the resist patterns according to the second preferred embodiment.

In forming the resist patterns 276, as shown in FIG. 29, first, a resist film 290 is formed on the surface of the substrate 102 to overlap on the lower electrode films 112. The resist film 290 can be formed in the same manner as the resist film 156 is formed, and as for a resist, the same type of the resist used for forming the resist film 156 can be used.

Figure 30:
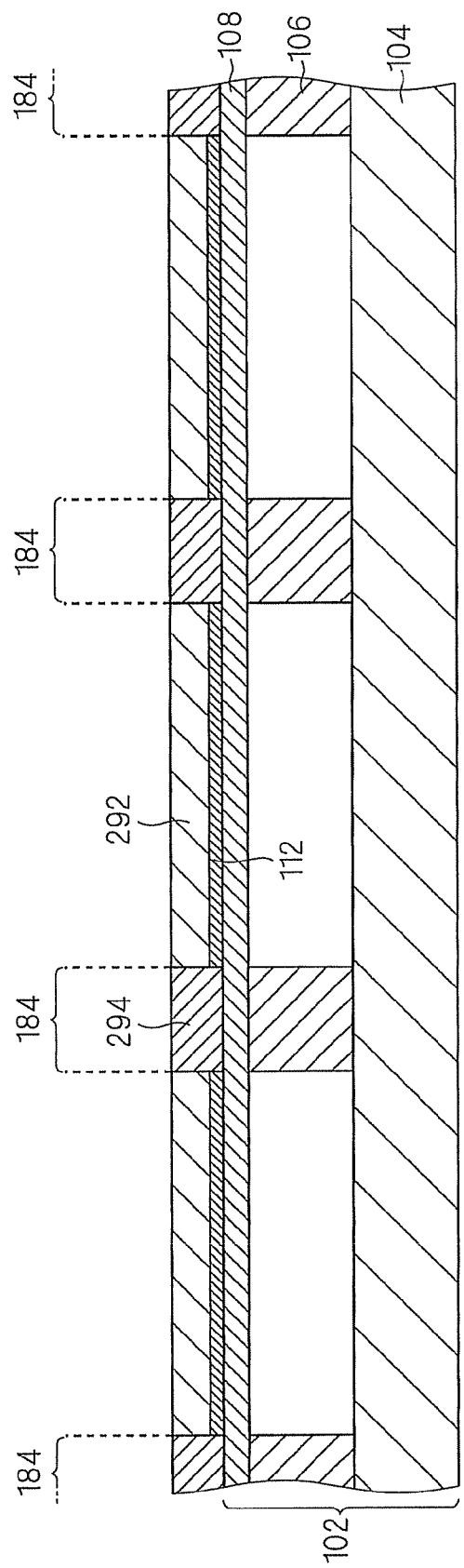
FIG. 30 is a view for illustrating the method of forming the resist patterns according to the second preferred embodiment.

After the resist film 290 is formed, as shown in FIG. 30, a light is irradiated from the back surface of the substrate 102, selectively exposing the resist film 290 formed in the non-cavity regions 184 where the lower electrode films 112 are not formed, to form unexposed parts 292 and exposed parts 294.

Thereby, a latent image in which a plane configuration of the lower electrode films 112 is reversely transferred is depicted on the resist film 290.

Figure 31:
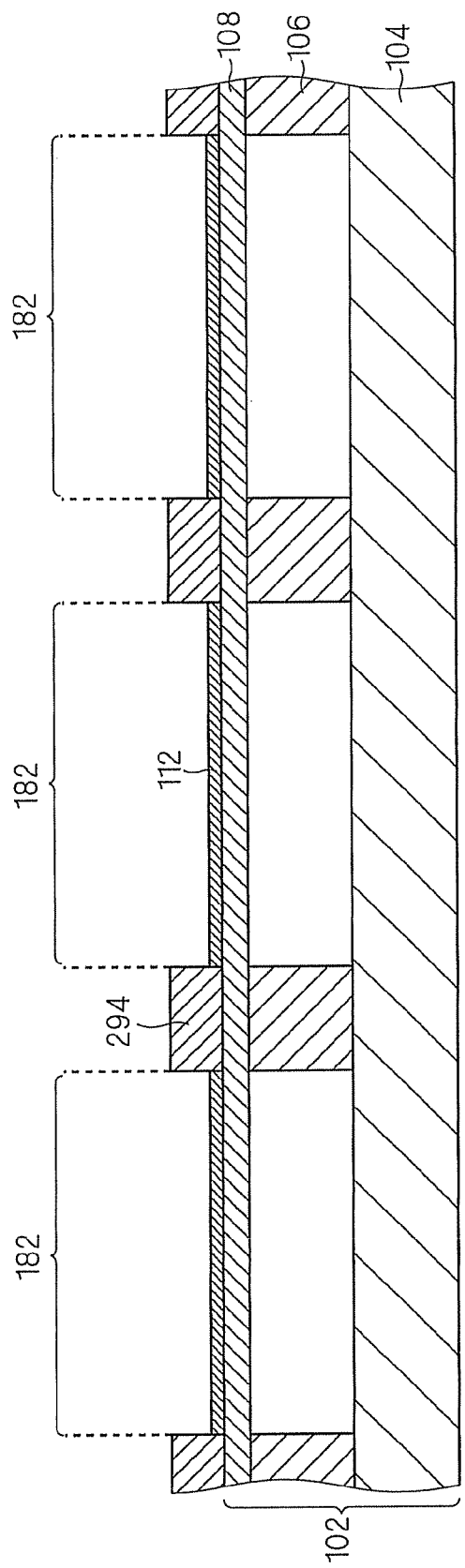
FIG. 31 is a view for illustrating the method of forming the resist patterns according to the second preferred embodiment.

After the latent image is depicted, as shown in FIG. 31, the unexposed parts 292 of the resist film 290 are removed by development. The development of the latent image can be performed similarly to the development of the latent image depicted on the resist film 156, and the same type of the developer can be used as the developer used for the latent image depicted on the resist film 156.

Figure 32:
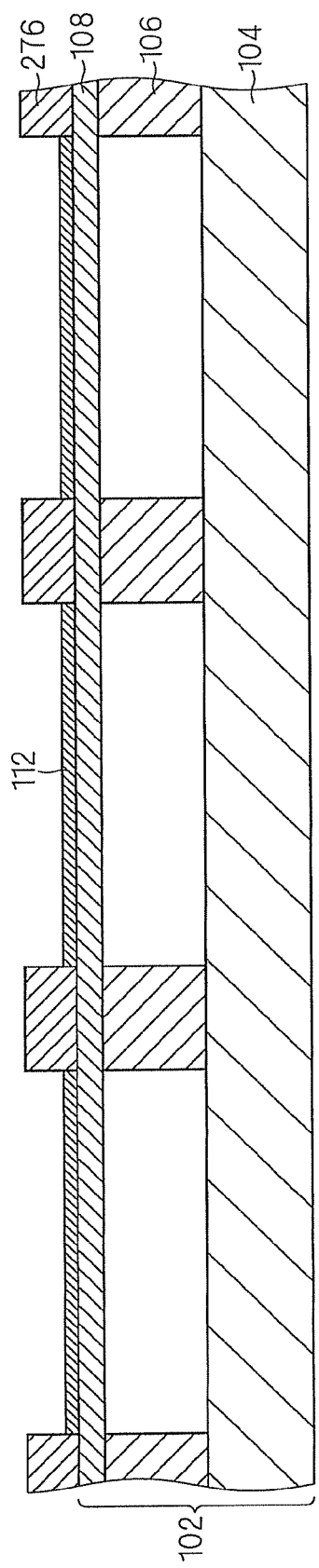
FIG. 32 is a view for illustrating the method of forming the resist patterns according to the second preferred embodiment.

After the latent image is developed, a light is irradiated from the surface of the substrate 102 to further expose the exposed parts 294 remaining in the non-cavity regions 184, baking the exposed parts 294. Thereby, the resist patterns 294 are completed, as shown in FIG. 32.

3. Third Preferred Embodiment

The third preferred embodiment relates to a method of forming resist patterns 342 employed instead of the method of forming the resist patterns 142 according to the first preferred embodiment.

<3.1 Method of Forming Resist Patterns 342>

FIGS. 33 to 38 are schematic views for illustrating the method of forming the resist patterns according to the third preferred embodiment. FIGS. 33 to 38 are schematic views of the work-in-process of the piezoelectric/electrostrictive film type element.

Figure 33:
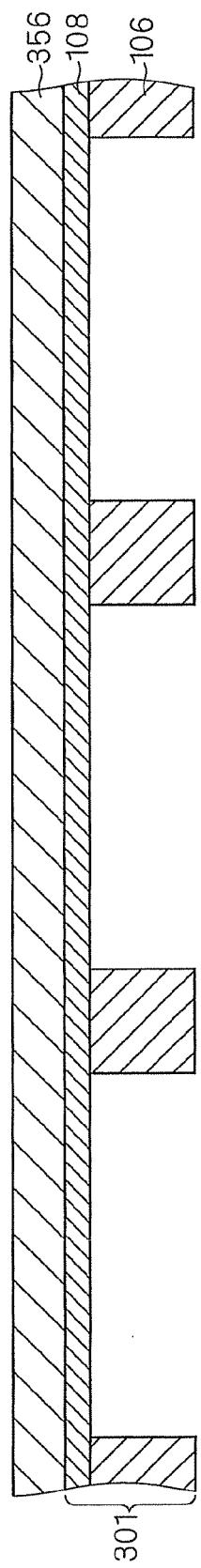
FIG. 33 is a view for illustrating the method of forming the resist patterns according to a third preferred embodiment.

In forming the resist patterns 342, as shown in FIG. 33, first, a resist film 356 is formed on a surface of a substrate 301 in which a base plate 106 and a diaphragm 108 are laminated from bottom to top in the order mentioned. The resist film 356 can be formed in the same manner as the resist film 156 is formed. As for a resist, a positive type in which the solubility to a developer increases when being exposed to a light is used. Accordingly, the resist film 356 is a photosensitive film in which the solubility to a developer increases when being exposed to a light. As for a resist, it is preferable to use a thick film compliant product applicable for forming a thick film for the resist, and more preferable to use a high aspect ratio compliant product in which a cross-sectional shape of a pattern is less likely to be tapered even if forming a pattern of the high aspect ratio.

Figure 34:
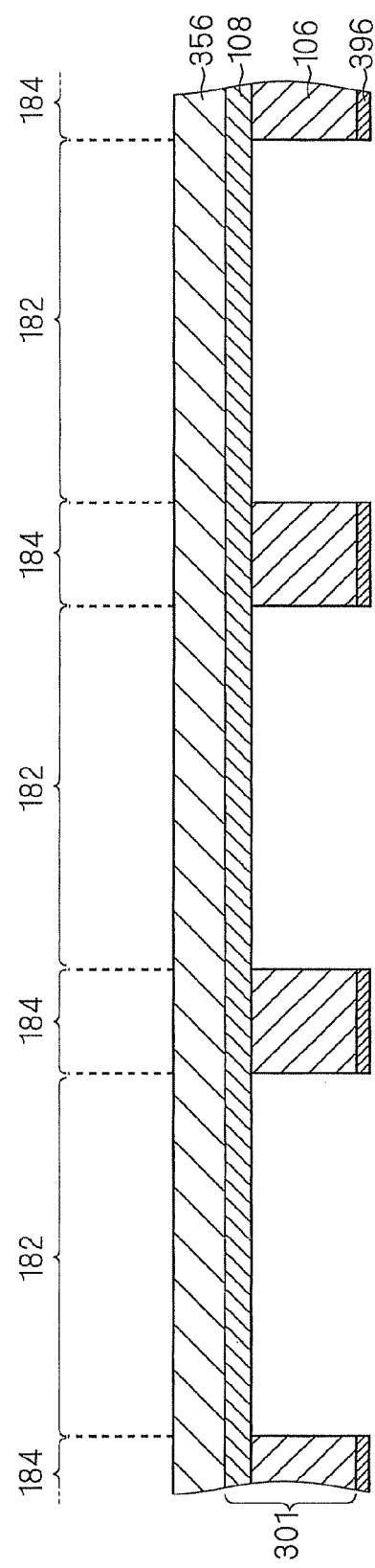
FIG. 34 is a view for illustrating the method of forming the resist patterns according to the third preferred embodiment.

After the resist film 356 is formed, as shown in FIG. 34, light shielding films 396 are formed in the non-cavity regions 184 on the back surface of the substrate 301, providing the substrate 301 with a function of a mask which shields the non-cavity regions 184 and does not shield the cavity regions 182. It is only adequate to form the light shielding films 396 before a light is irradiated from the back surface described below. Accordingly, the resist film 356 may be formed on the surface of the substrate 301 after forming the light shielding films 396. The light shielding films 396 are formed by applying a light shielding solution, where a solid portion of the light shielding films 396 dissolves in a solvent, or is dispersed in a dispersion medium, on the back surface of the substrate 301 with a spin coater, and evaporating the solvent or the dispersion medium from a coating film by heating the work-in-process with a hot plate, an oven or the like. Of course, the light shielding solution may be applied by any other similar techniques such as spraying. In these cases, it is preferable to mask the inside of the cavities 126 with a material to be removed later such as a solution, an organic resin, or any other similar materials, so that the light shielding films 396 are not intruded to the inside of the cavities 126. Also, as a method of forming the light shielding films 396, an offset printing and roller transfer of a transfer system, an impregnation printing or any other similar techniques may be employed.

The light shielding films 396 should preferably include a dye or pigment absorbing a light for exposure, and a pigment is specifically preferable. This is because when the light shielding films 396 include a pigment, the resolution of patterning can be improved. Since the difference of the transmittance between the light of the cavity regions 182 and the non-cavity regions 184 can be larger 6, the advantage of improving the resolution of patterning is produced by forming such a light shielding films 39. However, if enough difference of the light transmittance can be obtained even without forming the light shielding films 396, the step of forming the light shielding films 396 may be omitted.

Figure 35:
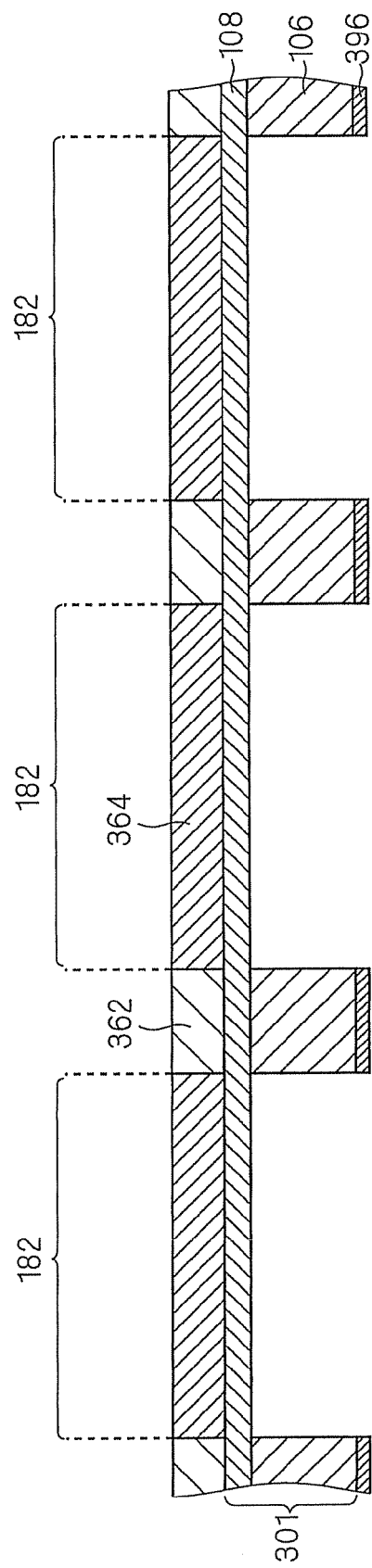
FIG. 35 is a view for illustrating the method of forming the resist patterns according to the third preferred embodiment.

After forming the resist film 356 and the light shielding films 396, as shown in FIG. 35, a light is irradiated from the back surface of the substrate 301 to selectively expose the resist film 356 formed on the cavity regions 182, forming unexposed parts 362 and exposed parts 364. As a result, a latent image in which a plane configuration of the cavities 126 is non-invertedly transferred is depicted on the resist film 356.

Figure 36:
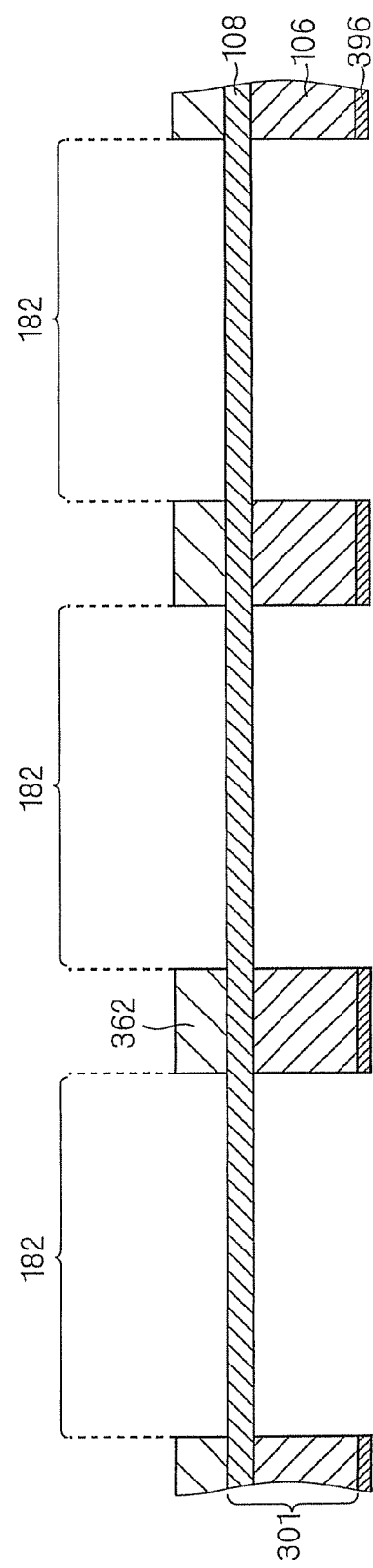
FIG. 36 is a view for illustrating the method of forming the resist patterns according to the third preferred embodiment.

After the latent image is depicted, as shown in FIG. 36, the exposed parts 364 of the resist film 356 formed on the cavity regions 182 are removed by development. The development of the latent image is performed by immersing and oscillating the work-in-process in the developer to remove the exposed parts 364, and thereafter cleansing the work-in-process with purified water or the like. The developer is selected to selectively dissolve the exposed parts 364 and not to dissolve the unexposed parts 362.

Figure 37:
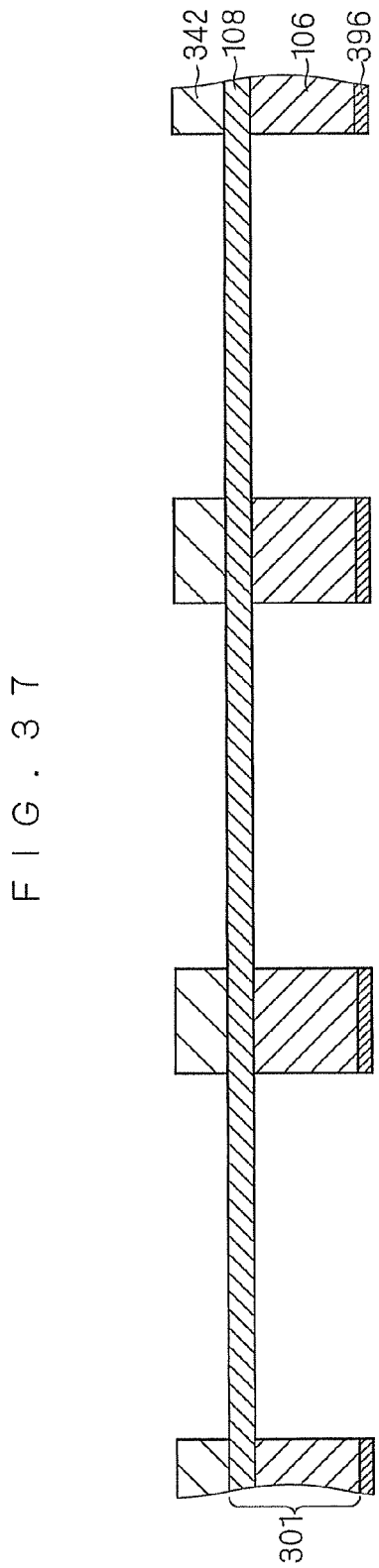
FIG. 37 is a view for illustrating the method of forming the resist patterns according to the third preferred embodiment.

After the latent image is developed, a light is irradiated from the surface of the substrate 301 to expose the unexposed parts 362 remaining in the non-cavity regions 184, baking the unexposed parts 362. Thereby, the resist patterns 342 are completed, as shown in FIG. 37.

After the resist patterns 342 are completed, as shown in FIG. 38, the light shielding films 396 are delaminated and removed. It is only adequate to delaminate the light shielding films 396 after a light is irradiated from the back surface described above. Accordingly, the exposed parts 364 of the resist film 356 may be removed after the light shielding films 396 are delaminated. The delamination of the light shielding films 396 may be made by a chemical method. Or, the delamination of the light shielding films 396 may be made by heat treatment, plasma treatment or any other similar techniques.

The resist patterns 342 formed as described above can function equally to the resist patterns 142 according to the first preferred embodiment. Similarly to the case of the first preferred embodiment, in order to suppress a projection at an edge of the conductive material films 144, the contact angle of the conductive paste to the resist patterns 342 should be preferably 50° and more, and more preferably 70° and more.

4. Fourth Preferred Embodiment

The fourth preferred embodiment relates to a process to suppress a projection at an edge of the conductive material films 144 (hereinafter, referred to as a "projection suppressing process") preferably performed after forming the resist patterns 142 of the first preferred embodiment, and before forming the conductive material films 144. This projection suppressing process is preferably performed in the case of employing the resist patterns 342 of the third preferred embodiment instead of the resist patterns 142 of the first preferred embodiment. The fourth preferred embodiment is preferably employed in the case where the contact angle of a conductive paste to the resist patterns 142, 342 of the first, or the third preferred embodiment cannot be made larger.

FIGS. 43 to 46 are views for illustrating the projection suppressing process in the fourth preferred embodiment. FIGS. 43 to 46 are sectional views of the work-in-process of the piezoelectric/electrostrictive film type element 1.

Figure 43:
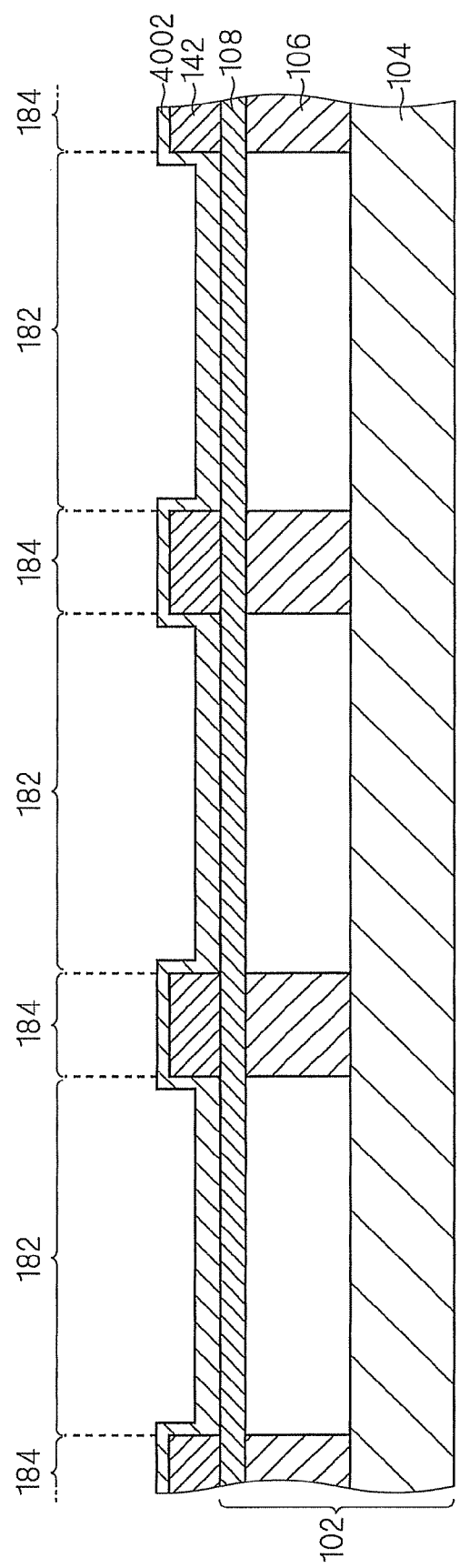
FIG. 43 is a view for illustrating a process to suppress a projection.

In the projection suppressing process, first, as shown in FIG. 43, a masking film 4002 is formed on the surface of the substrate 102 to overlap on the resist patterns 142 remaining in the non-cavity regions 184. The masking film 4002 is formed by applying a resin solution including epoxy resin, polyimide resin, or any other similar resin on the surface of the substrate 102 by a spin coater, heating with a hot plate, an oven or the like, or irradiating an ultraviolet with an ultraviolet lamp to cure a coating film. Of course, the application of the resin solution may be performed by any other similar techniques such as spraying.

Figure 44:
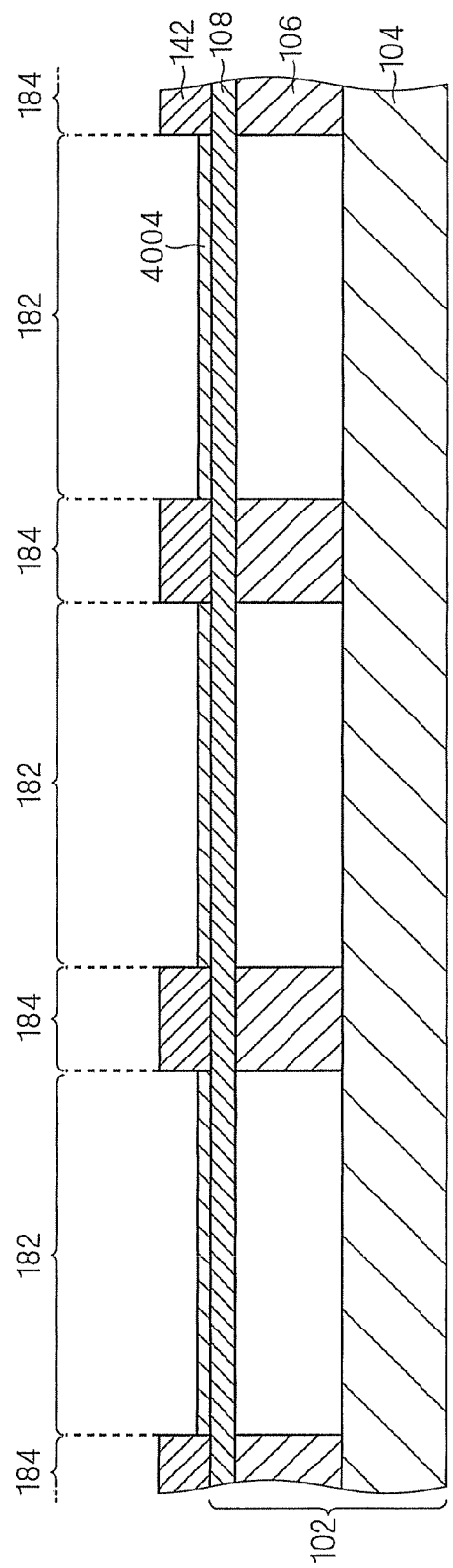
FIG. 44 is a view for illustrating the process to suppress a projection.

After the masking film 4002 is formed, as shown in FIG. 44, the masking film 4002 is removed until the resist patterns 142 are exposed. The masking film 4002 is removed by dissolving the masking film 4002 by immersing the work-in-process in a solvent or the like. Thereby, masking film patterns 4004 remaining in the cavity regions 182 are formed.

Figure 45:
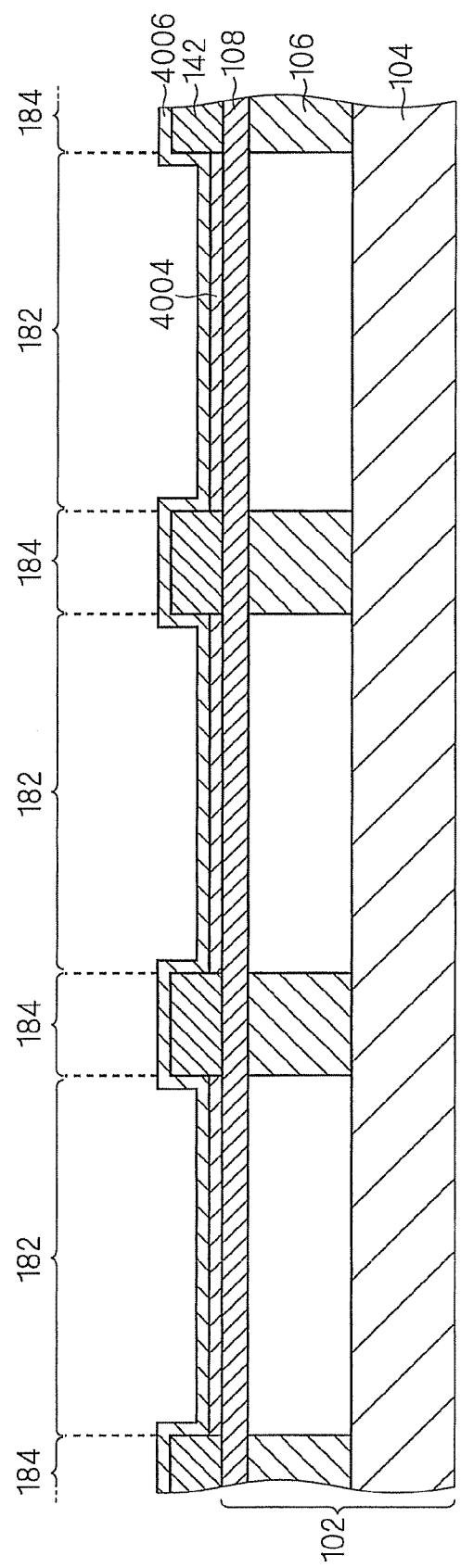
FIG. 45 is a view for illustrating the process to suppress a projection.

After the resist patterns 142 are exposed, as shown in FIG. 45, a water-repellent film 4006 is formed on the surface of the substrate 102 to overlap on the resist patterns 142 and the masking patterns 4004. As for the water-repellent film 4006, the water-repellency to a paste used for forming the lower electrode films 112 should be at least higher than that of the resist patterns 142, and the contact angle to the paste should be preferably 50° and more, and more preferably, 70° and more. The water-repellent film 4006 is formed by applying a water-repellent agent where a water-repellent material such as silicon resin, fluorine resin, or any other similar resin dissolves in a solvent, or is dispersed in a dispersion medium with a spin coater on the surface of the substrate 102, and evaporating the solvent from a coating film by heating the work-in-process with a hot plate, an oven or the like to cure the water-repellent material. Of course, the application of the water-repellent agent may be performed by any other similar techniques such as spraying. Also, when the water-repellent agent which is curable at an ordinary temperature is used, heating may be omitted.

Figure 46:
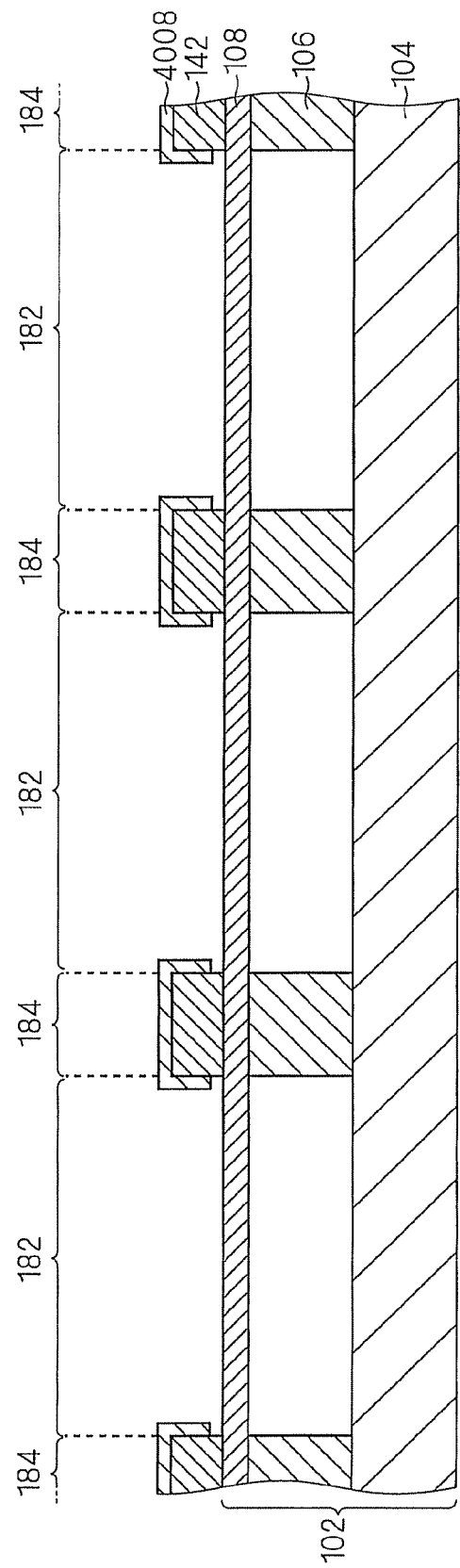
FIG. 46 is a view for illustrating the process to suppress a projection.
Figure 47:
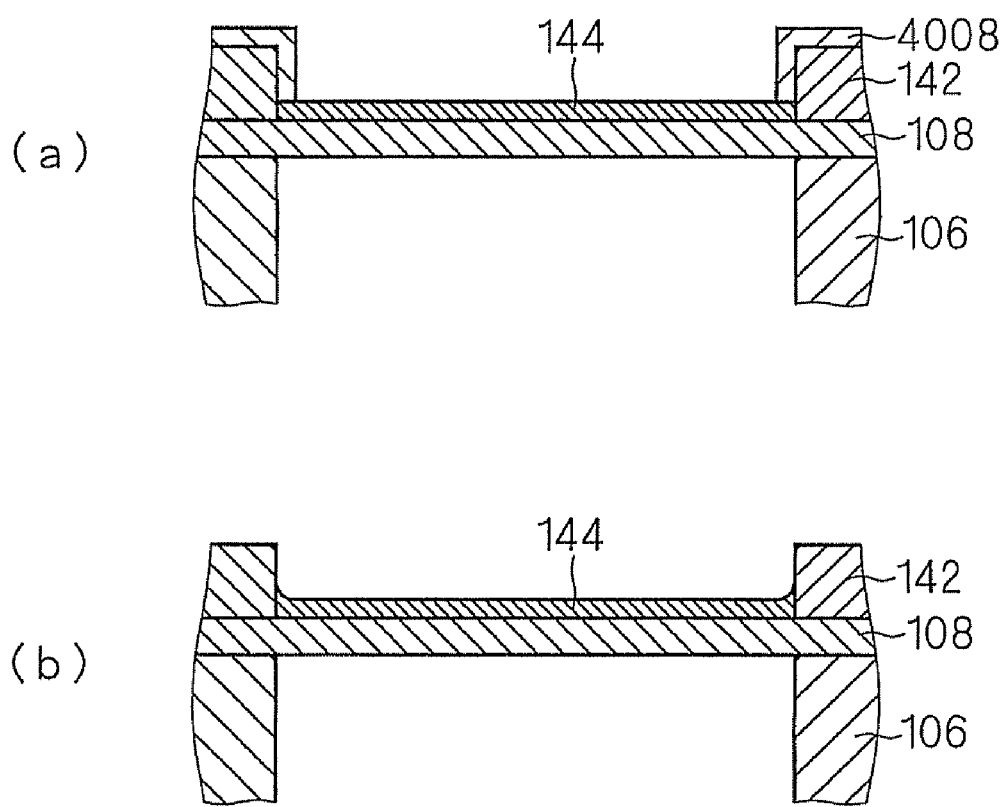
FIG. 47 is a view for showing a state with or without the projection in an edge part of a lower electrode film.

After the water-repellent film 4006 is formed, as shown in FIG. 46, masking film patterns 4004 and parts of water-repellent film 4006 formed on the cavity regions 182, i.e., the parts on the masking film patterns 4004 are removed. The masking film pattern 4004 and water-repellent film 4006 are removed by immersing the work-in-process in a solvent or any other similar techniques to dissolve the masking film patterns 4004. As a result, water-repellent films 4008 are formed to cover the resist patterns 142. The projections at an edge of the lower electrode films 112 as shown in FIG. 47B are suppressed by the water-repellent films 4008, and as shown in FIG. 47A, a paste is shed by the water-repellent films 4008 in forming the lower electrode films 112 to form the flat conductive material films 144. The water-repellent films 4008 are removed together with the resist patterns 142.

5. Fifth Preferred Embodiment

The fifth preferred embodiment relates to a method of forming water-repellent film patterns 5008 employed instead of the resist patterns 142 according to the first preferred embodiment, and the resist patterns 342 according to the third preferred embodiment.

FIGS. 48 to 54 are views for illustrating a method of forming the water-repellent patterns 5008 according to the fifth preferred embodiment. FIGS. 48 to 54 are sectional views of the work-in-process of the piezoelectric/electrostrictive film type element 1.

Figure 48:
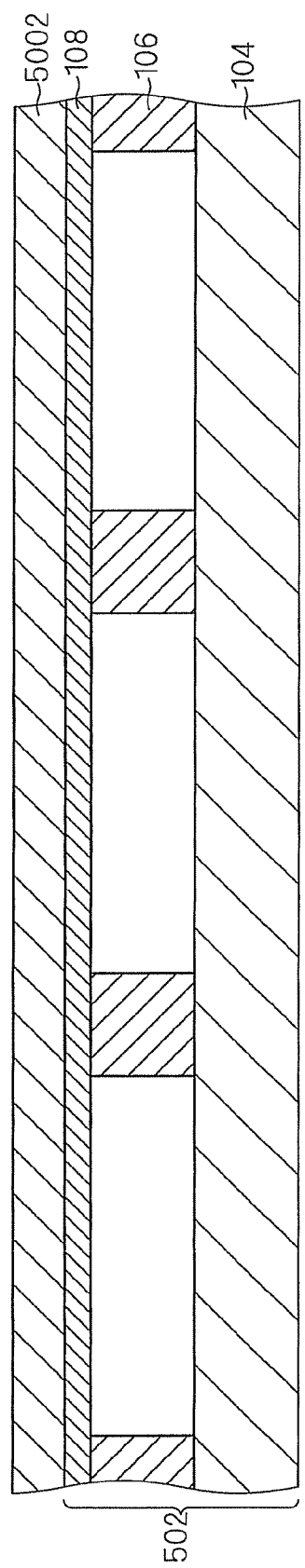
FIG. 48 is a view for illustrating a method of forming water-repellent film patterns according to a fifth preferred embodiment.

In forming the water-repellent patterns 5008, as shown in FIG. 48, first, a resist film 5002 is formed on a surface of a substrate 502 in which a base plate 104, a base plate 106, and a diaphragm 108 are laminated from bottom to top in the order mentioned. The resist film 5002 is formed in the same manner as the resist film 156 is formed. As for a resist, a positive type in which the solubility to a developer increases when being exposed to a light is used. Accordingly, the resist film 5002 is a photosensitive film in which the solubility to a developer increases when being exposed to a light. As for a resist, it is preferable to use a thick film compliant product applicable for forming a thick film for the resist, and more preferable to use a high aspect ratio compliant product in which a cross-sectional shape of a pattern is less likely to be tapered even if forming a pattern of the high aspect ratio.

Figure 49:
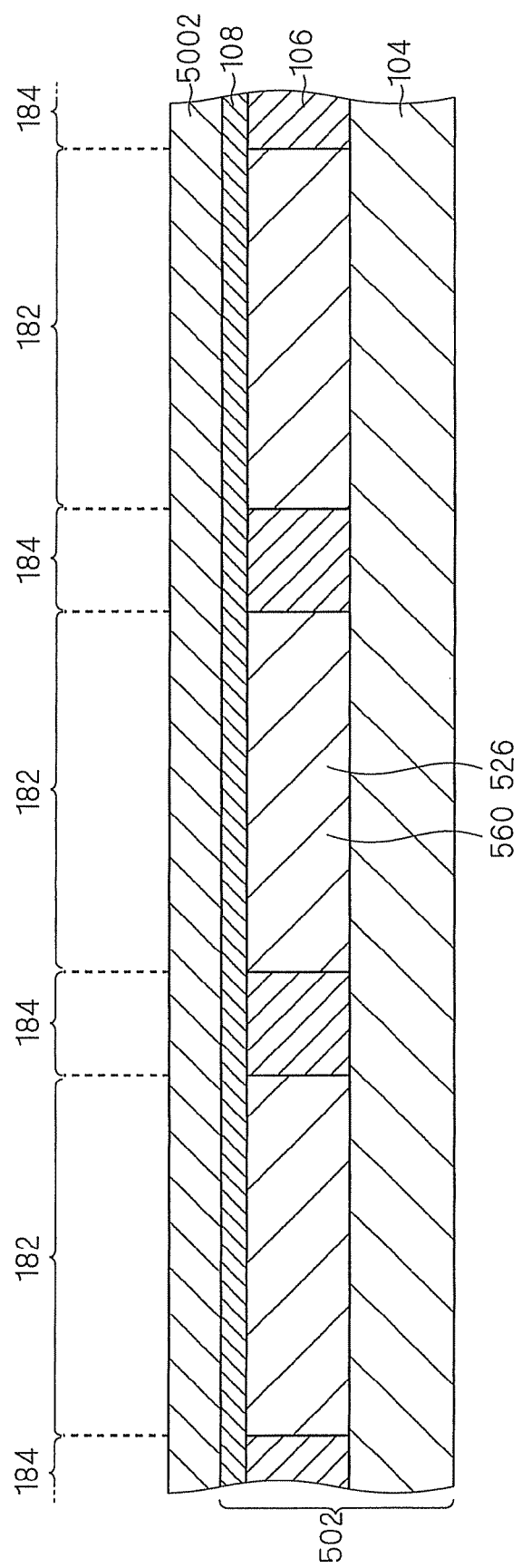
FIG. 49 is a view for illustrating the method of forming the water-repellent film patterns according to the fifth preferred embodiment.

After the resist film 5002 is formed, as shown in FIG. 49, the cavities 526 are filled with a light shielding agent 560 to provide the substrate 502 with a function of a mask which shields the cavity regions 182 and does not shield the non-cavity regions 184. The light shielding agent 560 is filled in the same manner as the light shielding agent 160 is filled. It is only adequate to fill the light shielding agent 560 to the cavities 526 before a light is irradiated from a back surface described below. Accordingly, a resist film 556 may be formed on the surface of the substrate 502 after filling the light shielding agent 560 into the cavities 526. The same type of a light shielding agent as the light shielding agent 160 can be used for the light shielding agent 560.

Figure 50:
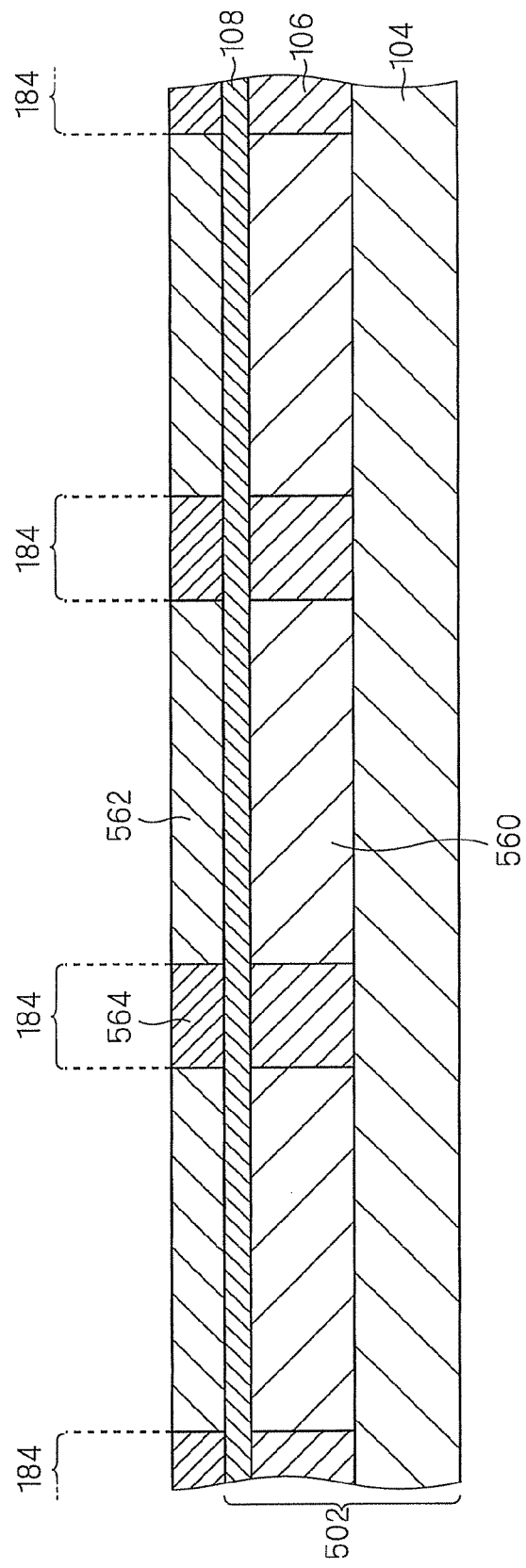
FIG. 50 is a view for illustrating the method of forming the water-repellent film patterns according to the fifth preferred embodiment.

After the resist film 556 is formed, and the light shielding agent 560 is filled into the cavities 526, as shown in FIG. 50, a light is irradiated from the back surface of the substrate 502 to selectively expose the resist film 556 formed on the non-cavity regions 184, forming unexposed parts 562 and exposed parts 564. Thereby, a latent image in which a plane configuration of the cavities 526 is reversely transferred is depicted on the resist film 556.

Figure 51:
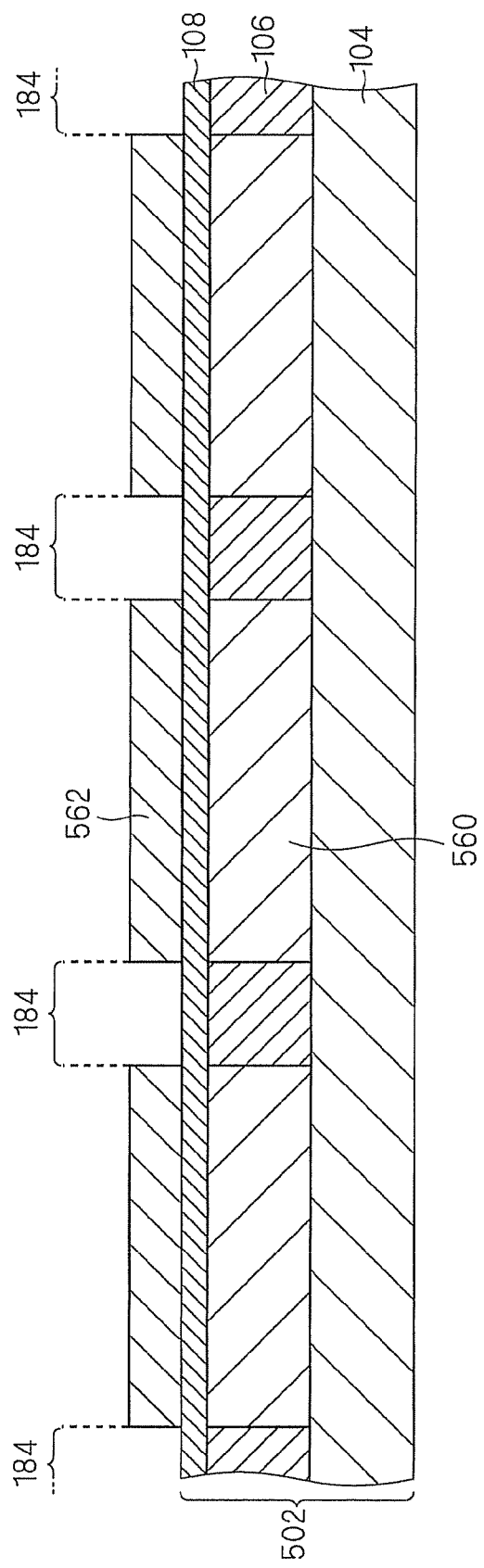
FIG. 51 is a view for illustrating the method of forming the water-repellent film patterns according to the fifth preferred embodiment.

After the latent image is depicted, as shown in FIG. 51, the exposed parts 564 of the resist film 556 formed on the non-cavity regions 184 are removed by development. The development of the latent image is performed by immersing and oscillating the work-in-process in the developer to remove the exposed parts 562, and thereafter cleansing the work-in-process with purified water or the like. The developer is selected to selectively dissolve the exposed parts 564 and not to dissolve the unexposed parts 562.

Figure 52:
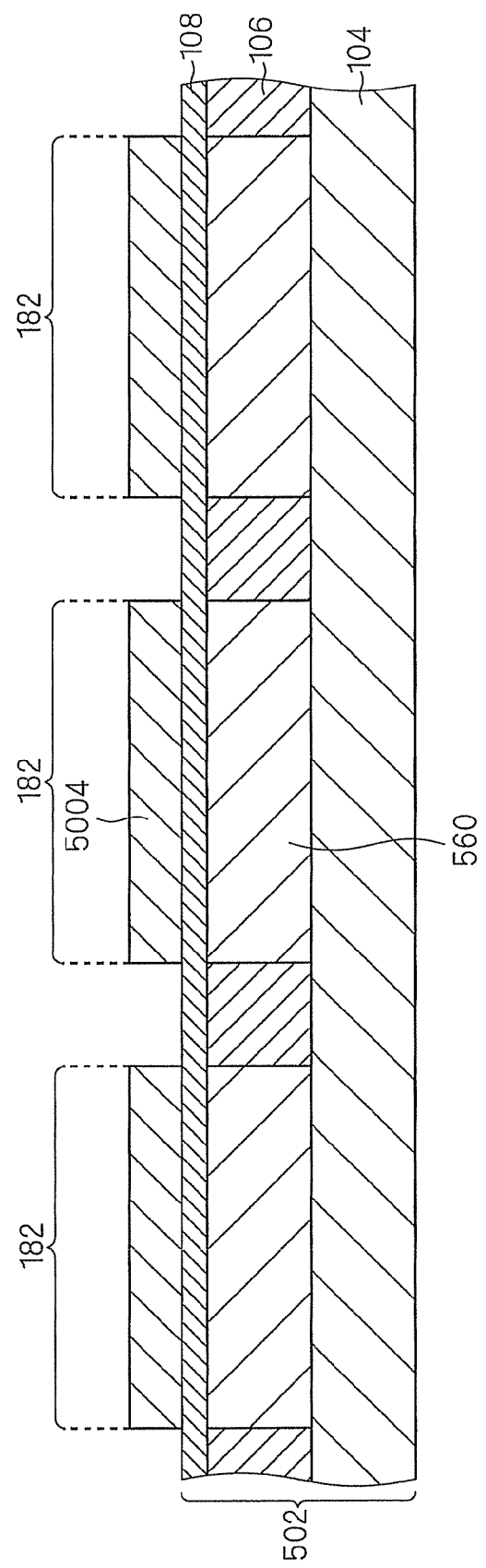
FIG. 52 is a view for illustrating the method of forming the water-repellent film patterns according to the fifth preferred embodiment.

After developing the latent image, a light is irradiated from a side of the surface of the substrate 502 to further expose the unexposed parts 562 remaining in the cavity regions 182, baking the unexposed parts 562. As a result, as shown in FIG. 52, resist patterns 5004 remaining in the cavity regions 182 are formed.

Figure 53:
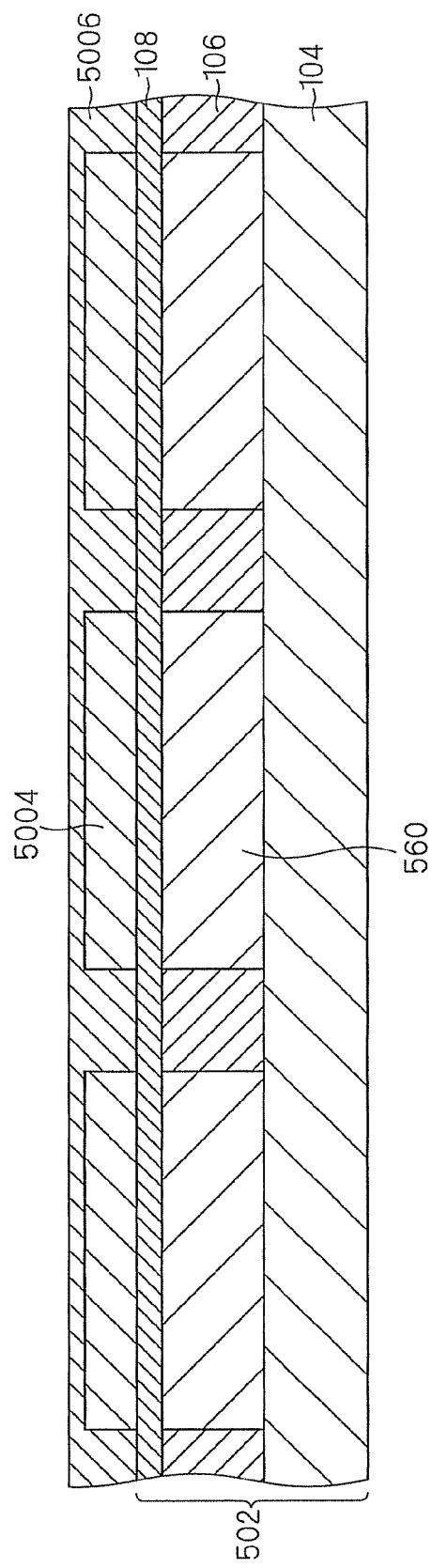
FIG. 53 is a view for illustrating the method of forming the water-repellent film patterns according to the fifth preferred embodiment.

After the resist patterns 5004 are formed, as shown in FIG. 53, a water-repellent film 5006 is formed on the surface of the substrate 502 to overlap on the resist patterns 5004. The water-repellent film 5006 can be formed in the same manner as the water-repellent film 4002 is formed. The same type of the water-repellent agent as the fourth preferred embodiment can be used.

Figure 54:
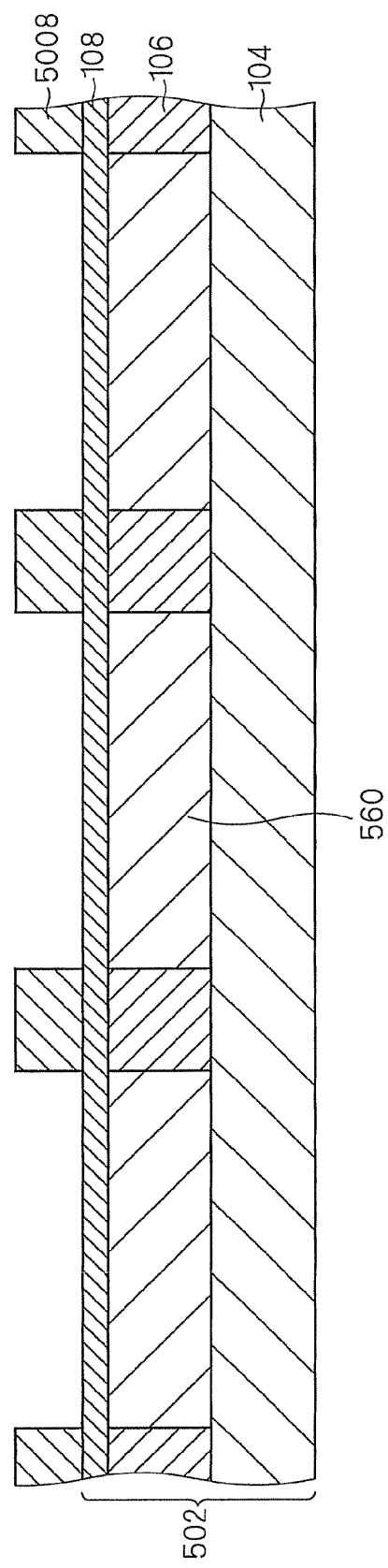
FIG. 54 is a view for illustrating the method of forming the water-repellent film patterns according to the fifth preferred embodiment.

After the water-repellent film 5006 is formed, as shown in FIG. 54, resist patterns 5004 and parts of water-repellent film 5006 formed on the cavity regions 182, i.e., the parts on the resist patterns 5004 are removed. The resist patterns 5004 and water-repellent film 5006 are removed by immersing the work-in-process in a solvent or the like to bring the solvent into contact with the resist patterns 5004 for dissolving the resist patterns 5004. As a result, water-repellent film patterns 5008 are completed. Since a paste is shed by the water-repellent film patterns 5008 when forming the lower electrode films 112 by employing the water-repellent film patterns 5008 instead of the resist patterns 142 and resist patterns 342, the projections at an edge of the lower electrode films 112 can be suppressed. The contact angle to the paste should be preferably 50° and more, and more preferably 70° and more. The water-repellent patterns 5008 can be removed in the same manner as the resist patterns 142 are removed.

6. Others

The manufacturing method of the piezoelectric/electrostrictive film type element is described above with an example of the case comprising an one layer of a piezoelectric/electrostrictive film, but the aforementioned manufacturing method of the piezoelectric/electrostrictive film type element can be used for the case comprising two and more layers of piezoelectric/electrostrictive films. That is, for the case comprising two and more layers of piezoelectric/electrostrictive films, as described in the first and third preferred embodiments, resist patterns are patterned with a substrate as a mask, and the lowermost lower electrode films or piezoelectric/electrostrictive films constituting laminated vibrators can be formed using the resist patterns. Also, as described in the first preferred embodiment, resist patterns are patterned with any piezoelectric/electrostrictive films constituting laminated vibrators as a mask to form electrode films on the piezoelectric/electrostrictive films using the resist patterns. On the other hand, as described in the second preferred embodiment, resist patterns are patterned with any electrode films constituting laminated vibrators as a mask to form the piezoelectric/electrostrictive films on the electrode films using the resist patterns.

The aforementioned manufacturing method of the piezoelectric/electrostrictive film type element can be employed not only for manufacturing a piezoelectric/electrostrictive film type element constituting a major part of a piezoelectric/electrostrictive actuator, but for manufacturing a piezoelectric/electrostrictive film type element comprising a substrate where a cavity is provided, and a laminated vibrator made of laminations of an electrode film and piezoelectric/electrostrictive film provided on a first main surface of the substrate so as to position with the cavity in a plane position, for example, a piezoelectric/electrostrictive resonator (FBAR; Film Bulk Acoustic Resonator) including a diaphragm structure and the like.

7. Others

Hereinafter, examples of forming resist patterns will be described.

Examples 1 to 3 and Comparative Examples 1, 2

In the examples 1 to 3, the resist patterns 142 were formed on the surface of the substrate 102 by the method of forming the resist patterns 142 according to the above-described first preferred embodiment. In the comparative examples 1 and 2, the resist patterns 142 were formed in the same manner as the examples 1 and 3, respectively, except for filling the light shielding agent 16 into the cavities 126.

Figure 40:
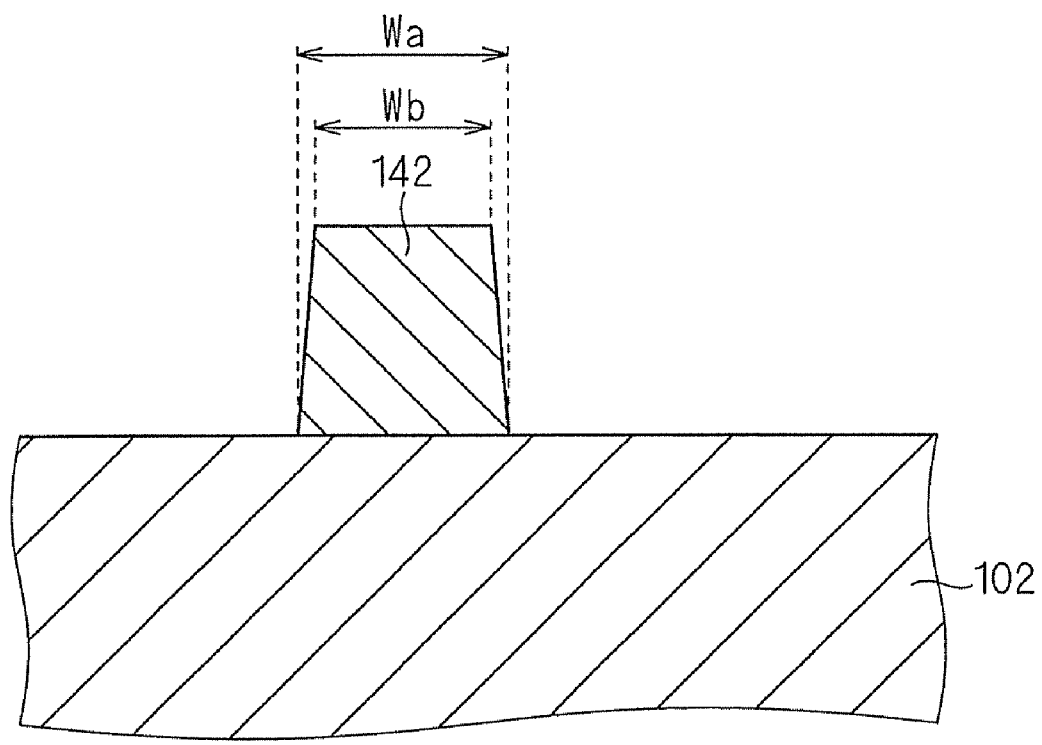
FIG. 40 is a view for illustrating an estimation method of the resist patterns.
Figure 42:
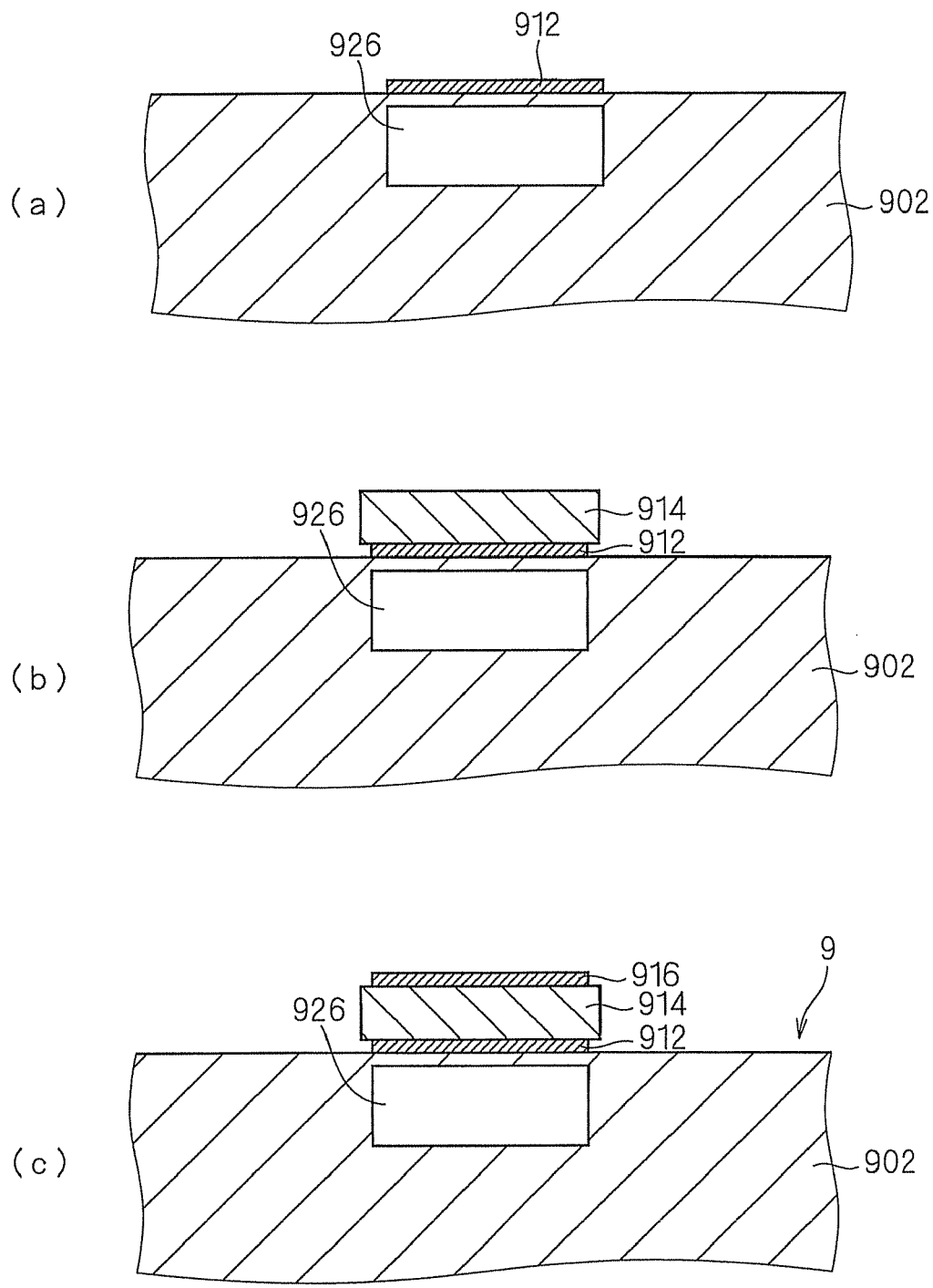
FIG. 42 is a sectional view for illustrating a conventional manufacturing method of the piezoelectric/electrostrictive film type element.

FIG. 39 is a list for showing the forming condition of the resist patterns 142 and the estimation result of the formed resist patterns 142 in the examples 1 to 3, and the comparative examples 1 and 2. FIG. 39 shows the presence or absence of the light shielding agent 160 filled into the cavities 126, the type of the light shielding agent, the plate thickness t1 of the base plate 104, the plate thickness t2 of the base plate 106, the plate thickness t3 of the diaphragm 108, and the estimation result of the resist patterns 142. "Dye-Related" recited in a column of "Type of Light Shielding Agent" shown in FIG. 39 means that a penetrant including dye is used as a light shielding solution, and "Pigment-Related" means that a resist solution including pigment (concentration of solid parts is 22%, OD value of a film thickness of 1.2 µm is 2.3) is used as a light shielding solution. The signs of "○", "Δ", and "×" recited in a column of the "Estimation Result" shown in FIG. 39 show the ratio Wb/Wa×100(%) (see a sectional view of FIG. 40) of an upper edge part Wb of an upper edge part of the respective resist patterns 142 not making contact with the substrate 102 to a width Wa of a lower edge part of the respective resist patterns 142 making contact with the substrate 102, being not less than 90%, not less than 50% and less than 90%, and less than 50%, respectively.

In the examples 1 to 3, and the comparative examples 1 and 2, the substrate 102 was manufactured by pressing ceramics green sheets of partially stabilized zirconium oxide and firing at a temperature of 1450° C., and the width W1 of the cavities 126 is 1 mm. Also, before the resist film 156 was formed on the surface of the substrate 102, the substrate 102 was heated to a temperature of 600° C. in an electric furnace in order to clean the surface of the substrate 102.

As for a resist, an acrylate resin-related thick film compliant product manufactured by TOKYO OHKA KOGYO CO., LTD. was used. The number of rotations was 1500 rpm, and the holding time was six seconds in forming the resist film 156 with a spin coater. The temperature was 90° C., and the time was 20 minutes in drying the resist film 156 with a hot plate.

As for an exposure system for depicting a latent image, a multilight USM10 manufactured by USHIO INC. which is an exposure system of three wavelength ranges of 365 nm, 405 nm, and 436 nm was used. The irradiation time was two minutes, and the accumulated light volume was 1300 mJ/cm$^2$ in irradiating a light from a side of the back surface of the substrate 102.

As for a developer, alkaline fluid which is a developer made by TOKYO OHKA KOGYO CO., LTD. for exclusive use of the above resist was used. The processing time in depicting a latent image was three minutes.

As for an exposure system in sintering the exposed part 164, the aforementioned multilight USM10 manufactured by USHIO INC. was used. The irradiation time in baking the exposed part 164 was four minutes.

As is clear from the estimation result shown in FIG. 39, when the resist patterns 142 are formed on the surface of the substrate 102 by the method of forming the resist patterns 142 according to the first preferred embodiment, the resolution of the resist patterns 142 can be improved by filling the light shielding agent 160 into the cavities 126, and the resolution of the resist patterns 142 can be further improved by filling the light shielding agent 160 including a pigment into the cavities 126. This results in the same way regardless of the plate thickness t1 of the base plate 104, the plate thickness t2 of the base plate 106, and the plate thickness t3 of the diaphragm 108.

Example 4

In the example 4, the resist patterns 342 were formed on the surface of the substrate 102 by the method of forming the resist patterns 342 according to the above-described third preferred embodiment.

FIG. 41 is a list for showing the forming condition of the resist patterns 342 and the estimation result of the formed resist patterns 342 in the example 4. The list of FIG. 41 recites the same items as the list of FIG. 39 such as the plate thickness t1 of the base plate 106, the plate thickness t2 of the base plate 104, the plate thickness t3 of the diaphragm 108, and the like.

In the example 4, the resist patterns 342 were formed in the similar forming conditions as the example 1, except for using different types of resist and developer and forming the light shielding film 396 on the back surface of the substrate 301 instead of filling the light shielding agent 160 into the cavities 126.

As is clear from the estimation result shown in FIG. 41, the resist patterns 342 can be formed on the surface of the substrate 301 by the method of forming the resist patterns 342 according to the third preferred embodiment.

While the invention has been shown and described in detail, the foregoing description is in all aspects illustrative and not restrictive. It is therefore understood that numerous modifications and variations can be devised without departing from the scope of the invention. Specifically, it is obviously intended to use the combination of what is described from the first to fifth preferred embodiments.

The invention claimed is:

1. A manufacturing method of a piezoelectric/electrostrictive film type element comprising a substrate in which a cavity is formed, and a laminated vibrator made of laminations of an electrode film and a piezoelectric/electrostrictive film provided on a first main surface of said substrate so as to position with said cavity in a plane position, the manufacturing method comprising the steps of:
    (a) forming a first photosensitive film on the first main surface of said substrate;
    (b) irradiating a light from a side of a second main surface of said substrate to transmit irradiated light used for exposure through said substrate and to depict a latent image, in which a plain shape of said cavity is transferred, on said first photosensitive film, wherein the second main surface is opposite to the first main surface of said substrate;
    (c) removing said first photosensitive film formed in a region where said cavity is formed, by development;
    (d) forming a lowermost film constituting said laminated vibrator in a region where said first photosensitive film is removed; and
    (e) removing said first photosensitive film remaining in a region where said cavity is not formed.

2. The manufacturing method of a piezoelectric/electrostrictive film type element according to claim 1, further comprising the step of:
    (f) before said step (b), filling a light shielding agent into said cavity; and wherein
    in said step (b), said first photosensitive film formed in the region where said cavity is not formed is selectively exposed, and in said step (c), an unexposed part of said first photosensitive film is removed.

3. The manufacturing method of a piezoelectric/electrostrictive film type element according to claim 2, wherein said light shielding agent includes a pigment.

4. The manufacturing method of a piezoelectric/electrostrictive film type element according to claim 1, wherein
    in said step (b), said first photosensitive film formed in the region where said cavity is formed is selectively exposed, and in said step (c), an exposed part of said first photosensitive film is removed.

5. The manufacturing method of a piezoelectric/electrostrictive film type element according to claim 4, further comprising the step of:
    (g) before said step (b), forming a light shielding film in a region in the second main surface of said substrate where said cavity is not formed.

6. The manufacturing method of a piezoelectric/electrostrictive film type element according to claim 5, wherein said light shielding film includes a pigment.

7. The manufacturing method of a piezoelectric/electrostrictive film type element according to claim 1, further comprising the steps of:
    (h) after said step (e), forming a second photosensitive film to overlap on any piezoelectric/electrostrictive film constituting said laminated vibrator on the first main surface of said substrate;
    (i) irradiating a light from a side of the second main surface of said substrate to selectively expose said second photosensitive film formed in a region where said any piezoelectric/electrostrictive film is not formed;
    (j) removing an unexposed part of said second photosensitive film;
    (k) forming an electrode film constituting said laminated vibrator in a region where said second photosensitive film is removed; and
    (l) removing said second photosensitive film remaining in the region where said any piezoelectric/electrostrictive film is not formed.

8. The manufacturing method of a piezoelectric/electrostrictive film type element according to claim 1, further comprising the steps of:
    (m) after said step (e), forming a second photosensitive film to overlap on any electrode film constituting said laminated vibrator on the first main surface of said substrate;
    (n) irradiating a light from a side of the second main surface of said substrate to selectively expose said second photosensitive film formed in a region where said any electrode film is not formed;
    (o) removing an unexposed part of said second photosensitive film;
    (p) forming a piezoelectric/electrostrictive film constituting said laminated vibrator in a region where said second photosensitive film is removed; and
    (q) removing said second photosensitive film remaining in the region where said any electrode film is not formed.

9. The manufacturing method of a piezoelectric/electrostrictive film type element according to claim 1, further comprising the step of:
    (r) after said step (e), forming a piezoelectric/electrostrictive film constituting said laminated vibrator by electrophoresis of a piezoelectric/electrostrictive material toward any electrode film constituting said laminated vibrator.

10. The manufacturing method of a piezoelectric/electrostrictive film type element according to claim 1, further comprising the step of:
    (s) after said step (c) and before said step (d), covering said first photosensitive film remaining in the region where said cavity is not formed, with a water-repellent film having higher water-repellency than said first photosensitive film.

11. The manufacturing method of a piezoelectric/electrostrictive film type element according to claim 10, wherein
said step (s) comprises the steps of:
- (s-1) forming a masking film on the first main surface of said substrate to overlap on said first photosensitive film remaining in the region where said cavity is not formed;
- (s-2) removing said masking film until said first photosensitive film remaining in the region where said cavity is not formed is exposed;
- (s-3) forming a water-repellent film on the first main surface of said substrate to overlap on said first photosensitive film remaining in the region where said cavity is not formed, and said masking film remaining in the region where said cavity is formed; and
- (s-4) removing said water-repellent film remaining in the region where said cavity is formed, and said masking film remaining in the region where said cavity is formed.

12. A manufacturing method of a piezoelectric/electrostrictive film type element comprising a substrate in which a cavity is formed, and a laminated vibrator made of laminations of an electrode film and a piezoelectric/electrostrictive film provided on a first main surface of said substrate so as to position with said cavity in a plain position, the manufacturing method comprising the steps of:
- (a) forming a first photosensitive film on the first main surface of said substrate;
- (b) irradiating a light from a side of a second main surface of said substrate to transmit irradiated light used for exposure through said substrate and to depict a latent image, in which a plain shape of said cavity is transferred, on said first photosensitive film, wherein the second main surface is opposite to the first main surface of said substrate;
- (c) removing said first photosensitive film formed in a region where said cavity is not formed, by development;
- (d) forming a water-repellent film on the first main surface of said substrate to overlap on said first photosensitive film remaining in a region where said cavity is formed;
- (e) removing said first photosensitive film remaining in the region where said cavity is formed and said water-repellent film formed in the region where said cavity is formed;
- (f) forming a lowermost film constituting said laminated vibrator in a region where said first photosensitive film and said water-repellent film are removed; and
- (g) removing said water-repellent film remaining in the region where said cavity is not formed.

13. The manufacturing method of a piezoelectric/electrostrictive film type element according to claim 12, further comprising the step of:

- (h) before said step (b), filling a light shielding agent into said cavity; and wherein
  in said step (b), said first photosensitive film formed in the region where said cavity is not formed is selectively exposed, and in said step (c), an exposed part of said first photosensitive film is removed.

14. The manufacturing method of a piezoelectric/electrostrictive film type element according to claim 13, wherein
said light shielding agent includes a pigment.

15. The manufacturing method of a piezoelectric/electrostrictive film type element according to claim 12, further comprising the steps of:
- (i) after said step (g), forming a second photosensitive film to overlap on any piezoelectric/electrostrictive film constituting said laminated vibrator on the first main surface of said substrate;
- (j) irradiating a light from a side of the second main surface of said substrate to selectively expose said second photosensitive film formed in a region where said any piezoelectric/electrostrictive film is not formed;
- (k) removing an unexposed part of said second photosensitive film;
- (l) forming an electrode film constituting said laminated vibrator in a region where said second photosensitive film is removed; and
- (m) removing said second photosensitive film remaining in the region where said any piezoelectric/electrostrictive film is not formed.

16. The manufacturing method of a piezoelectric/electrostrictive film type element according to claim 12, further comprising the steps of:
- (n) after said step (g), forming a second photosensitive film to overlap on any electrode film constituting said laminated vibrator on the first main surface of said substrate;
- (o) irradiating a light from a side of the second main surface of said substrate to selectively expose said second photosensitive film formed in a region where said any electrode film is not formed;
- (p) removing an unexposed part of said second photosensitive film;
- (q) forming a piezoelectric/electrostrictive film constituting said laminated vibrator in a region where said second photosensitive film is removed; and
- (r) removing said second photosensitive film remaining in the region where said any electrode film is not formed.

17. The manufacturing method of a piezoelectric/electrostrictive film type element according to claim 12, further comprising the step of:
- (s) after said step (g), forming a piezoelectric/electrostrictive film constituting said laminated vibrator by electrophoresis of a piezoelectric/electrostrictive material toward any electrode film constituting said laminated vibrator.

* * * * *